United States Patent
McChesney et al.

(10) Patent No.: US 10,410,836 B2
(45) Date of Patent: Sep. 10, 2019

(54) SYSTEMS AND METHODS FOR TUNING TO REDUCE REFLECTED POWER IN MULTIPLE STATES

(71) Applicant: Lam Research Corporation, Fremont, CA (US)

(72) Inventors: Jon McChesney, Fremont, CA (US); Alexander Paterson, San Jose, CA (US)

(73) Assignee: Lam Research Corporation, Fremont, CA (US)

(*) Notice: Subject to any disclaimer, the term of this patent is extended or adjusted under 35 U.S.C. 154(b) by 0 days.

(21) Appl. No.: 15/878,222

(22) Filed: Jan. 23, 2018

(65) Prior Publication Data

US 2018/0240647 A1    Aug. 23, 2018

Related U.S. Application Data

(60) Provisional application No. 62/462,300, filed on Feb. 22, 2017.

(51) Int. Cl.
| | |
|---|---|
| *H03H 7/38* | (2006.01) |
| *H03H 7/40* | (2006.01) |
| *H01J 37/32* | (2006.01) |
| *H01J 37/244* | (2006.01) |

(52) U.S. Cl.
CPC ....... *H01J 37/32183* (2013.01); *H01J 37/244* (2013.01); *H01J 37/3244* (2013.01); *H01J 37/3255* (2013.01); *H03H 7/38* (2013.01); *H03H 7/40* (2013.01)

(58) Field of Classification Search
None
See application file for complete search history.

(56) References Cited

U.S. PATENT DOCUMENTS

| | | | | |
|---|---|---|---|---|
| 8,513,889 | B2* | 8/2013 | Zhang | H01J 37/32183 |
| | | | | 118/715 |
| 9,196,459 | B2* | 11/2015 | Bhutta | H01J 37/32183 |
| 9,325,282 | B2* | 4/2016 | Bowers | H03F 3/195 |
| 9,508,529 | B2* | 11/2016 | Valcore, Jr. | H01J 37/32082 |
| 9,595,424 | B2* | 3/2017 | Marakhtanov | H01J 37/32183 |
| 9,711,332 | B2* | 7/2017 | Howald | H01J 37/32183 |
| 9,761,414 | B2* | 9/2017 | Marakhtanov | H01J 37/32091 |
| 9,885,493 | B2* | 2/2018 | Sriraman | H01J 37/321 |
| 10,074,520 | B2* | 9/2018 | Valcore, Jr. | H01J 37/32183 |
| 2009/0061544 | A1* | 3/2009 | Holland | H01J 37/32935 |
| | | | | 438/14 |
| 2009/0274590 | A1* | 11/2009 | Willwerth | H01L 21/67109 |
| | | | | 422/186.04 |

(Continued)

OTHER PUBLICATIONS

Intl. Search Report PCT/US2018/018720, dated Jun. 5, 2018, 7 pages.

*Primary Examiner* — Dion Ferguson
*Assistant Examiner* — Srinivas Sathiraju
(74) *Attorney, Agent, or Firm* — Penilla IP, APC

(57) ABSTRACT

Systems and methods for tuning to reduce reflected power in multiple states are described. The methods include determining values of one or more parameters of an impedance matching circuit so that reflected power is reduced for multiple states. Such a reduction in the reflected power increases a life of a radio frequency generator coupled to the impedance matching circuit while simultaneously processing a substrate using the multiple states.

20 Claims, 14 Drawing Sheets

(56) References Cited

U.S. PATENT DOCUMENTS

| | | | |
|---|---|---|---|
| 2014/0210508 A1* | 7/2014 | Valcore, Jr. | H01J 37/32917 324/764.01 |
| 2014/0214350 A1* | 7/2014 | Valcore, Jr. | H01J 37/32174 702/64 |
| 2014/0214351 A1* | 7/2014 | Valcore, Jr. | H01J 37/32183 702/65 |
| 2014/0214395 A1* | 7/2014 | Valcore, Jr. | G06F 17/5063 703/14 |
| 2015/0037981 A1* | 2/2015 | Sriraman | H01L 21/3065 438/714 |
| 2015/0069912 A1* | 3/2015 | Valcore, Jr. | H03J 7/00 315/111.21 |
| 2015/0076112 A1* | 3/2015 | Sriraman | H01J 37/32082 216/67 |
| 2015/0303033 A1* | 10/2015 | Bhutta | H01J 37/32183 315/111.51 |
| 2015/0313000 A1 | 10/2015 | Thomas et al. | |
| 2016/0118227 A1* | 4/2016 | Valcore, Jr. | H01J 37/32082 216/61 |
| 2016/0189932 A1 | 6/2016 | Valcore, Jr. et al. | |
| 2016/0196958 A1 | 7/2016 | Leray et al. | |
| 2016/0259872 A1* | 9/2016 | Howald | G06F 17/5063 |
| 2016/0260584 A1* | 9/2016 | Marakhtanov | H01J 37/32183 |
| 2016/0307736 A1* | 10/2016 | Howald | H01J 37/32183 |
| 2016/0308560 A1* | 10/2016 | Howald | G06F 17/5063 |
| 2016/0322207 A1* | 11/2016 | Howald | H01J 37/32926 |
| 2016/0343548 A1* | 11/2016 | Howald | G01R 27/02 |
| 2016/0351375 A1* | 12/2016 | Valcore, Jr. | H01J 37/32082 |
| 2017/0084432 A1* | 3/2017 | Valcore, Jr. | H01J 37/32926 |
| 2017/0103872 A1* | 4/2017 | Howald | H01J 37/32183 |
| 2017/0103875 A1* | 4/2017 | McChesney | H01J 37/32119 |
| 2017/0104469 A1* | 4/2017 | Mavretic | H01L 21/3065 |
| 2017/0365907 A1* | 12/2017 | Kapoor | H03H 7/40 |
| 2018/0005802 A1* | 1/2018 | Chen | H01J 37/32146 |
| 2018/0175819 A1* | 6/2018 | Rangineni | C23C 16/45544 |
| 2018/0262196 A1* | 9/2018 | Wu | H03K 19/00384 |

* cited by examiner

SYSTEMS AND METHODS FOR TUNING TO REDUCE REFLECTED POWER IN MULTIPLE STATES

CLAIM OF PRIORITY

The present patent application claims the benefit of and priority, under 35 U.S.C. § 119(e), to U.S. Provisional Patent Application No. 62/462,300, filed on Feb. 22, 2017, and titled "Systems and Methods for Tuning to Reduce Reflected Power in Multiple States", which is incorporated by reference herein in its entirety for all purposes.

FIELD

The present embodiments relate to systems and methods for tuning to reduce reflected power in multiple states.

BACKGROUND

Generally, a plasma tool includes a radio frequency generator, an impedance match network, and a plasma chamber. The radio frequency generator supplies power to the plasma chamber via the impedance match network. When the power is supplied, one or more gases are also provided to the plasma chamber to generate plasma within the plasma chamber. The plasma is used for a variety of cleaning operations as well as other operations that are performed on a wafer in the plasma chamber.

However, when the power is supplied, power of the plasma is reflected back towards the RF generator. This reflected power builds standing waves on a transmission line between a source and a load and the standing waves may result in destruction of the RF generator output drive.

It is in this context that embodiments described in the present disclosure arise.

SUMMARY

Embodiments of the disclosure provide systems and methods for tuning to reduce reflected power in multiple states. It should be appreciated that the present embodiments can be implemented in numerous ways, e.g., a process, an apparatus, a system, a device, or a method on a computer-readable medium. Several embodiments are described below.

During semiconductor plasma processing, an applied radio frequency (RF) power is pulsed at frequencies between 1 hertz and 50 kilohertz. A tuned matching network is used to couple the RF power to plasma to ensure efficient coupling between an RF generator and the plasma. During continuous wave (CW) or single level pulsing, the matching network is fixed. However, in some cases two or more level pulsing is employed in which case two or more matching network positions, e.g., capacitor values, inductor values, etc., are used. The matching network employs variable reactive components, such as capacitors and inductors. These variable reactive components have mechanical parts, which move slowly compared to the multi-level pulsing. The slow reaction of the mechanical parts makes it difficult to keep up with multiple level power levels of the multi-level pulsing. This can be partially mitigated by employing frequency tuning between the multiple power levels. However, frequency tuning alone cannot accommodate widely divergent power levels. The methods and systems describe how to optimize the matching network positions to maximize matching efficiency throughout a process for the multi-level pulsing. The matching efficiency is improved and power that is reflected towards the RF generator is reduced. An average reflected RF power towards the RF generator is reduced to allow for a wider operating space.

In some embodiments, a method for tuning to reduce reflected power in multiple states is described. The method includes supplying, by an RF generator, power during a first state of a digital pulsed signal to a plasma chamber via an impedance matching circuit. The method further includes measuring an amount of power reflected at an output of the RF generator during the first state. The method includes supplying, by the RF generator, power during a second state of the digital pulsed signal to the plasma chamber via the impedance matching circuit. The method also includes measuring an amount of power reflected at the output of the RF generator during the second state. The method includes controlling a parameter of the impedance matching circuit to reduce the amount of power measured during the first state to a minimum and to reduce the amount of power measured during the second state to a minimum.

In various embodiments, a system for tuning to reduce reflected power in multiple states is described. The system includes an RF generator configured to supply power during a first state of a digital pulsed signal. The system further includes an impedance matching circuit coupled to the RF generator via an RF cable and a plasma chamber coupled to the impedance matching circuit via an RF transmission line. The system includes a sensor coupled to an output of the RF generator. The sensor is configured to measure an amount of power reflected at the output of the RF generator during the first state. The RF generator is configured to supply power during a second state of the digital pulsed signal to the plasma chamber via the impedance matching circuit. The sensor is configured to measure an amount of power reflected at the output of the RF generator during the second state. The system includes a processor coupled to the impedance matching circuit to control a parameter of the impedance matching circuit. The parameter is controlled to reduce the amount of power measured during the first state to a minimum and to reduce the amount of power measured during the second state to a minimum.

In various embodiments, a non-transitory computer readable medium storing a program causing a computer to execute a method is described. The method includes supplying, by an RF generator, power during a first state of a digital pulsed signal to a plasma chamber via an impedance matching circuit. The method further includes receiving a measurement of an amount of power reflected at an output of the RF generator during the first state. The method includes supplying, by the RF generator, power during a second state of the digital pulsed signal to the plasma chamber via the impedance matching circuit. The method includes receiving a measurement of an amount of power reflected at the output of the RF generator during the second state. The method includes controlling a parameter of the impedance matching circuit to reduce the amount of power measured during the first state to a minimum and to reduce the amount of power measured during the second state to a minimum.

Some advantages of the herein described systems and methods for tuning to reduce reflected power in multiple states. For example, when a series circuit of an impedance matching circuit has a value A and/or a shunt circuit of the impedance matching circuit has a value B, a power that is reflected towards an RF generator is reduced for a plurality of states S0, S1, S2, S3, and so on compared to power reflected towards the RF generator for any one of the states S0, S1, S2, and S3 and so on for which the series circuit has a value C and/or the shunt circuit has a value D. Such a reduction in the reflected power for the multiple states increases a life of the RF generator towards which the power is reflected. Moreover, the multiple states are used to perform a variety of operations on a substrate. For example, during one of the states, materials, such as oxides, are deposited on the substrate and during another one of the states, the substrate or the materials are etched. As another example, during one of the states, a deposition operation is performed on the substrate, and during another one of the states, the substrate is cleaned. As yet another example, during one of the states, a deposition operation is performed on the substrate, during another one of the states, the substrate is cleaned, and during yet another one of the states, an etch operation is performed on the substrate. When the impedance matching circuit has the values A and B, with the reduction in power for the multiple states, the variety of operations are performed on the substrate while simultaneously protecting components of the RF generator.

Also, with the reduction in reflected power for the states S0, S1, S2, S3, and so on, an efficiency of the impedance matching circuit is improved. The impedance matching circuit allows a higher amount of power to be supplied to a plasma chamber when the series circuit of the impedance matching circuit has the value A and/or the shunt circuit of the impedance matching circuit has the value B. The supply of the higher amount of power is important for low amplitude RF signals that are supplied by the RF generator.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

DETAILED DESCRIPTION

The following embodiments describe systems and methods for tuning to reduce reflected power in multiple states. It will be apparent that the present embodiments may be practiced without some or all of these specific details. In other instances, well known process operations have not been described in detail in order not to unnecessarily obscure the present embodiments.

Figure 1A:
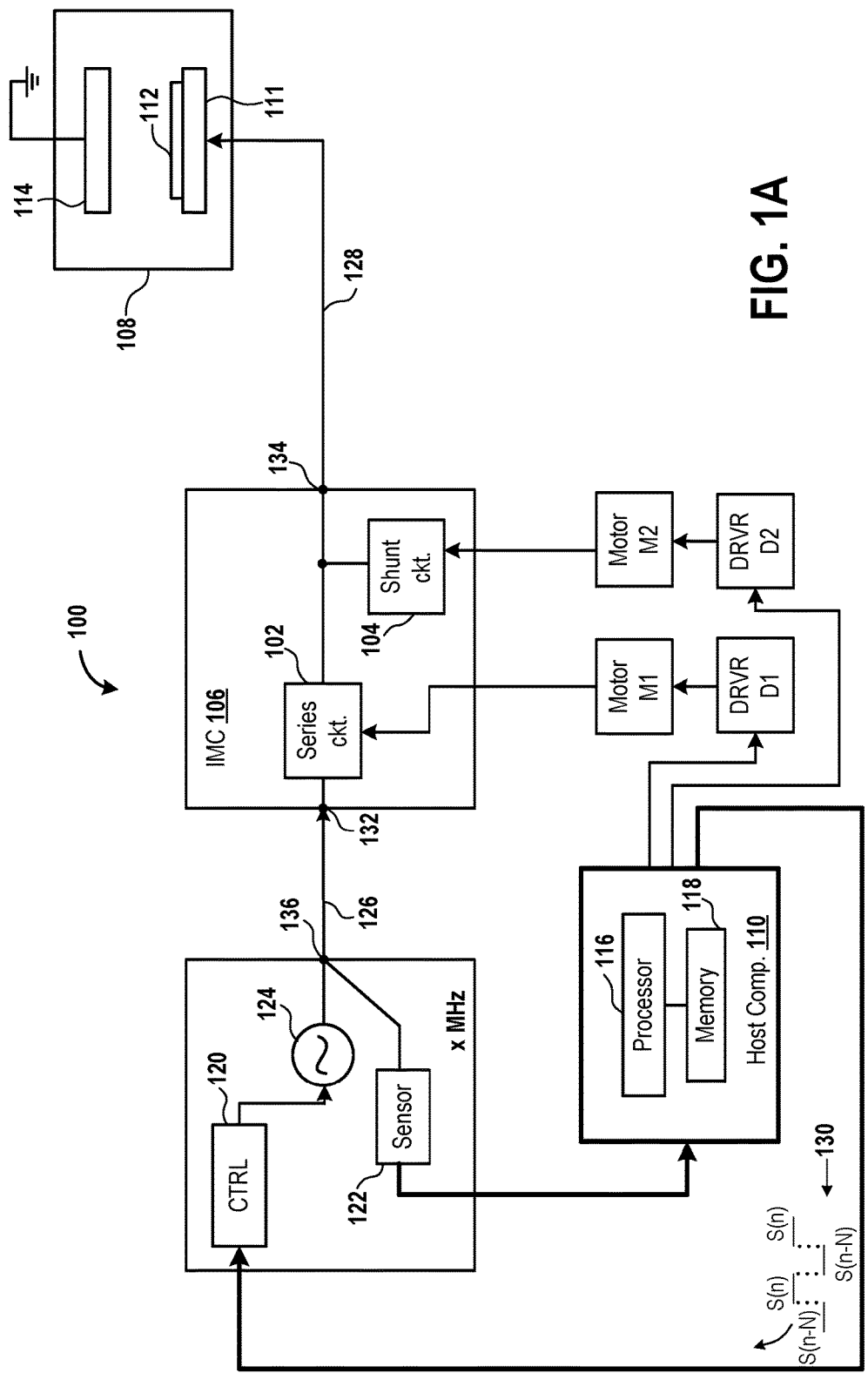
FIG. 1A is a diagram of an embodiment of a system to illustrate a determination of a parameter of a series circuit and a parameter of a shunt circuit to reduce power reflected towards an x megahertz (MHz) radio frequency (RF) generator for a plurality of states S(n–N) through S(n).

FIG. 1A is a diagram of an embodiment of a system 100 to illustrate a determination of a parameter of a series circuit 102 and a parameter of a shunt circuit 104 to reduce power reflected towards an x megahertz (MHz) radio frequency (RF) generator. The system 100 includes the x megahertz RF generator, an impedance matching circuit (IMC) 106, a plasma chamber 108 a host computer 110, a motor M1, a motor M2, a driver (DRVR) D1, and a driver D2.

An example of the x megahertz RF generator is a 2 MHz RF generator. The impedance matching circuit 106 includes one or more series circuits, e.g., a series circuit 102, and one or more shunt circuits, e.g., a shunt circuit 104. An output of each of the shunt circuits is coupled to ground, e.g., a zero potential, a non-zero reference potential, etc. Each shunt circuit or each series circuit includes one or more electrical components, e.g., one or more capacitors, or one or more resistors, or one or more inductors, or a combination of one or more capacitors and one or more resistors, or a combination of one or more capacitors and one or more inductors, or a combination of one or more resistors and one or more inductors, or a combination of one or more capacitors and one or more resistors and one or more inductors. Some of the one or more electrical components are coupled with each other in a serial manner or a parallel manner. An end of the series circuit 102 is coupled to an input 132 of the impedance matching circuit 106 and another end of the series circuit 102 is coupled to an output 134 of the impedance matching circuit 106. Moreover, an end of the shunt circuit 104 is coupled to the series circuit 102 and the output 134 of the impedance matching circuit 106 and another end of the shunt circuit 104 is coupled to the ground.

The plasma chamber 108 includes a chuck 111, e.g., an electrostatic chuck (ESC) on which a substrate 112 is placed, an upper electrode 114, and other parts (not shown), e.g., an upper dielectric ring surrounding the upper electrode 114, an upper electrode extension surrounding the upper dielectric ring, a lower dielectric ring surrounding a lower electrode of the chuck 111, a lower electrode extension surrounding the lower dielectric ring, an upper plasma exclusion zone (PEZ) ring, a lower PEZ ring, etc. Examples of the substrate 112 include a wafer on which integrated circuits are fabricated or to be fabricated. Each of the upper electrode 114 and the chuck 111 is made of a metal, e.g., aluminum, alloy of aluminum, copper, a combination of copper and aluminum, etc.

Examples of the host computer 110 include a desktop computer, a laptop computer, a tablet, a smartphone, etc. The host computer 110 includes one or more processors, e.g., a processor 116, and one or more memory devices, e.g., a memory device 118. As used herein, a processor is an application specific integrated circuit (ASIC), or a programmable logic device, or a microprocessor, or a central processing unit (CPU). Moreover, as used herein, a memory device is a random access memory (RAM) or a read-only memory (ROM) or a combination of RAM and ROM. Examples of a motor, as described herein, include an electrical machine that converts electrical energy into mechanical energy. For example, a motor includes a stator and a rotor. The rotor rotates when electrical current is supplied to windings of the stator to convert the electrical energy into mechanical energy. Examples of a driver, as described herein, include one or more transistors that generate a current signal upon receiving a control signal from the processor 116.

The x megahertz RF generator is coupled to the impedance matching circuit 106 via an RF cable 126. Moreover, the impedance matching circuit 106 is coupled to the chuck 111 via an RF transmission line 128. The RF transmission line 128 is an RF cylinder, e.g., a tunnel. Within a hollow of the RF cylinder lies an insulator and an RF rod. The RF rod is surrounded by the insulator, which is surrounded by the RF cylinder.

The x megahertz RF generator includes a control system 120, a sensor 122, and an RF power supply 124. Examples of a control system, as described herein, include one or more power controllers, or one or more auto frequency tuners (AFTs), or a combination of the one or more power controllers and the one or more auto frequency tuners. The control system further includes a digital signal processor (DSP) that is coupled to the one or more power controllers and the one or more auto frequency tuners. An example of a sensor, as described herein, includes a power sensor or a complex voltage and current sensor. An example of an RF power supply, as described herein, includes a driver and an RF oscillator coupled with each other. Upon receiving a current signal from the driver, the RF oscillator generates a radio frequency oscillating signal, e.g., a sinusoidal RF signal.

A sensor, as described herein, is coupled to the processor 116 via a data cable, e.g., a serial transfer cable, a parallel transfer cable, or a universal serial bus (USB) cable, etc. Similarly, a control system, as described herein, e.g., the DSP of the control system, is coupled to the processor 116 via a data cable. A motor, as described herein, is coupled to a series circuit or a shunt circuit via one or more connection mechanisms, e.g., one or more rods, a combination of one or more rods and one or more gears, etc.

The processor 116 generates a digital pulsed signal 130 and provides the digital pulsed signal 130 to the control system 120. The digital pulsed signal 130 has two or more states, e.g., a state S(n–N) through a state S(n), where n is an integer equal to or greater than 1, N is an integer also equal to or greater than 1, and n is greater than N. For example, when S(n) is S2, S(n–N) is S1. As another example, when S(n) is S3, S(n–N) is S1, and there is an intermediate state S2 between the two states S1 and S3.

The control system 120, e.g., the DSP, receives the digital pulsed signal 130 and determines whether the digital pulsed signal 130 has the state S(n–N) or the state S(n) based on a logic level of the digital pulsed signal 130. For example, the state S(n–N) has a logic level of 0 and the state S(n) has a logic level of 1. As another example, the state S0 has a logic level of L1, the state S1 has a logic level of L2, the state S2 has a logic level of L3, and the state S3 has a logic level of L4. The logic level of L4 is greater than the logic level of L3, which is greater than a logic level of L2. The logic level of L2 is greater than the logic level of L1.

Upon determining that the state of the digital pulsed signal 130 is S(n–N), the control system 120 identifies a power level for the state S(n–N) and a frequency level for the state S(n–N), and provides the power level and the frequency level to the RF power supply 124. For example, one of the power controllers for the state S(n–N) identifies the power level for the state S(n–N) upon receiving an indication from the digital signal processor of the control system 120 that the state of the digital pulsed signal 130 is S(n–N) and provides the power level to the RF power supply 124. Moreover in this example, one of the auto frequency tuners for the state S(n–N) identifies the frequency level for the state S(n–N) upon receiving an indication from the digital signal processor of the control system 120 that the state of the digital pulsed signal 130 is S(n–N) and provides a frequency level to the RF power supply 124. As an example, the power level and the frequency level for the state S(n–N) are received from the processor 116 by the control system 120. Upon receiving the power level and the frequency level for the state S(n–N), the RF power supply 124 generates an RF signal having the power level and the frequency level for the state S(n–N) and supplies the RF signal for the state S(n–N) via an output 136 and the RF cable 126 to the impedance matching circuit 106. The output 136 is of the x MHz RF generator.

Similarly, upon determining that the state of the digital pulsed signal 130 is S(n), the control system 120 identifies a power level for the state S(n) and a frequency level for the state S(n), and provides the power level and the frequency level to the RF power supply 124. For example, one of the power controllers for the state S(n) identifies the power level for the state S(n) upon receiving an indication from the digital signal processor of the control system 120 that the state of the digital pulsed signal 130 is S(n) and provides the power level to the RF power supply 124. Moreover in this example, one of the auto frequency tuners for the state S(n) identifies the frequency level for the state S(n) upon receiving an indication from the digital signal processor of the control system 120 that the state of the digital pulsed signal 130 is S(n) and provides a frequency level to the RF power supply 124. As an example, the power level and the frequency level for the state S(n) are received from the processor 116 by the control system 120. Upon receiving the power level and the frequency level for the state S(n), the RF power supply 124 generates the RF signal having the power level and the frequency level for the state S(n) and sends the RF signal for the state S(n) via the RF cable 126 to the impedance matching circuit 106.

When the RF signal for the state S(n−N) is received from the x MHz RF generator by the impedance matching circuit 106, the impedance matching circuit 106 matches an impedance of a load, e.g., the RF transmission line 128 and the plasma chamber 108, that is coupled to the output 134 of the impedance matching circuit 106 with that of a source, e.g., the RF cable 126 and the x megahertz RF generator, that is coupled to the input 132 of the impedance matching circuit 106. The impedance matching circuit 106 matches the impedances to generate a modified RF signal for the state S(n−N) that is provided from the impedance matching circuit 106 via the output 134 and the RF transmission line 128 to the chuck 111.

Similarly, when the RF signal for the state S(n) is received from the x MHz RF generator by the impedance matching circuit 106, the impedance matching circuit 106 matches an impedance of the load that is coupled to the output 134 of the impedance matching circuit 106 with that of the source that is coupled to the input 132 of the impedance matching circuit 106. The impedance matching circuit 106 matches the impedances to generate the modified RF signal for the state S(n) that is provided from the impedance matching circuit 106 via the RF transmission line 128 to the chuck 111.

When the modified RF signal is supplied to the chuck 111, one or more process gases for processing the substrate 112 are supplied to the plasma chamber 108. Examples of the process gases include an oxygen-containing gas and a fluorine-containing gas. Examples of the fluorine-containing gas include tetrafluoromethane (CF4), sulfur hexafluoride (SF6), hexafluoroethane (C2F6), etc. When the modified RF signal is supplied to the chuck 111 and the one or more process gases are supplied to the plasma chamber 108, e.g., through one or more holes in the upper electrode 114, plasma is stricken within the plasma chamber 108 and the plasma is used to process the substrate 112. Examples of processing the substrate 112 include etching the substrate 112, depositing materials, e.g., an oxide layer, a metal layer, a copper layer, etc., over the substrate 112, sputtering the substrate 112, cleaning the substrate 112, etc., to fabricate one or more integrated circuit chips on the substrate 112.

During the state S(n−N), the sensor 122 that is coupled to the output 136 of the x MHz RF generator senses values of a variable, e.g., complex voltage and current, complex power, complex reflected power, etc. The reflected power is power that is reflected towards the output 136 of the x MHz RF generator from the plasma of the plasma chamber 108 via the RF transmission line 128, the impedance matching circuit 106, and the RF cable 126. Similarly, during the state S(n), the sensor 122 senses values of the variable.

Values of the variable sensed during the states S(n−N) through S(n), e.g., multiple occurrences of the states S(n−N) through S(n), multiple cycles of the states S(n−N) and S(n), multiple instances of the states S(n−N) and S(n), etc., are continuously provided from the sensor 122 to the processor 116 via the data cable. The processor 116 determines values of one or more parameters of the one or more electrical components of the impedance matching circuit 106 from the variable sensed during the states S(n−N) through S(n) until the reflected power is simultaneously reduced for the states S(n−N) through S(n) compared to reflected power that is reduced for one of the states S(n−N) through S(n) but not for the other one(s) of the states S(n−N) through S(n). For example, the values of the one or more parameters are determined such that an amount of power reflected at the output 136 for all the states S(n−N) through S(n) is less than an amount of power reflected at the output 136 for any one of the states S(n−N) through S(n). To further illustrate, an amount of power reflected towards the output 136 during the state S1 when a value of a capacitance of the series circuit 102 is C1 and a value of a capacitance of the shunt circuit 104 is C2 is Pr1. However, when the same values C1 and C2 are used for the state S2, an amount of power reflected towards the output 136 during the state S2 is Pr2, which is substantially greater than Pr1. The same values of C1 and C2 are used due to physical limitations of the one or more electrical components, e.g., capacitors, inductors, etc., values of which cannot be changed as quickly as changes in the states S(n−N) through S(n). The components are of the impedance matching circuit 106. When the values, e.g., a value C3 of the parameter of the series circuit 102 and a value C4 of the parameter of the shunt circuit 104, of one or more parameters of the one or more electrical components of the impedance matching circuit 106 are determined from the variable sensed during the states S(n−N) through S(n) so that the reflected power is simultaneously reduced for the states S(n−N) through S(n), the reflected power is of an amount Pr3. The value Pr3 is less than the value Pr2 but is greater than the value Pr1. In some embodiments, the value Pr3 is equal to or less than the value Pr1. Examples of the parameters include an inductance and a capacitance.

As another illustration, an amount of power reflected towards the output 136 during the state S1 when the value of a capacitance of the series circuit 102 is C1 and a value of a capacitance of the shunt circuit 104 is C2 is Pr1. The value Pr1 is a minima, which is further described below, for the state S1. Moreover, an amount of power reflected towards the output 136 during the state S2 when the value of a capacitance of the series circuit 102 is C5 and a value of a capacitance of the shunt circuit 104 is C6 is Pr4. The value Pr4 is a minima, which is further described below, for the state S2. For the states S1 and S2, a mean of the values C1 and C5 is used as a capacitance for the series circuit 102. Moreover, for the states S1 and S2, a mean of the values C2 and C6 is used as a capacitance for the shunt circuit 104. For the means of the values C1 and C5 and the mean of the values C2 and C6, power reflected towards the x MHz RF generator is reduced for the states S1 and S2.

As yet another illustration, when the values, e.g., the value C3 of the parameter of the series circuit 102 and the value C4 of the parameter of the shunt circuit 104, of one or more parameters of the impedance matching circuit 106 are determined from the variable sensed during the states S(n−N) through S(n) so that the reflected power is simultaneously reduced for the states S(n−N) through S(n), the reflected power is of an amount Pr3 for the state S(n−N) and is of an amount Pr4 for the state S(n). The value Pr3 is a minima for the state S(n−N) among values of reflected power for the state S(n−N). The values of the reflected power for the state S(n−N) are achieved when a frequency of the x MHz RF generator and/or power of the RF signal supplied by the x MHz RF generator is varied during the state S(n−N). The value Pr4 is a minima for the state S(n) among values of reflected power for the state S(n). The values of the reflected power for the state S(n) are achieved when a frequency of the x MHz RF generator and/or power of the RF signal supplied by the x MHz RF generator is varied during the state S(n). In various embodiments, the minima for the state S(n–N) is within a pre-determined threshold of the minima for the state S(n). In some embodiments, the minima for the state S(n–N) is within the pre-determined threshold of the minima for the state S(n) and both the minimas are lower than a pre-determined level of reflected power. In some embodiments, the terms pre-determined level and pre-determined limit are used interchangeably herein. The value Pr2 is greater than the pre-determined level and the value Pr1 is less than the pre-determined level.

During the states S(n–N) through S(n), the processor 116 sends and continues to send a control signal to the driver D1 indicating a value of the parameter for the states S(n–N) through S(n) until the reflected power is reduced at the output 136 for the states S(n–N) through S(n). Upon receiving the control signal, motor M1 rotates to change a value of the parameter of the series circuit 102 via the one or more connection mechanisms that couples the motor M1 to the series circuit 102. Similarly, during the states S(n–N) through S(n), the processor 116 sends and continues to send a control signal to the driver D2 indicating a value of the parameter for the states S(n–N) through S(n) until the reflected power is reduced at the output 136 for the states S(n–N) through S(n). Upon receiving the control signal, motor M2 rotates to change a value of the parameter of the shunt circuit 104 via the one or more connection mechanisms that couple the motor M2 to the shunt circuit 104.

The reduction in the reflected power at the output 136 increases a life of the x MHz RF generator. The reflected power causes damage to components, e.g., the control system 120, the RF power supply 124, etc., of the x MHz RF generator. The reduction in the reflected power for the states S(n–N) through S(n) at the output 136 reduces chances of the components of the x MHz RF generator being damaged to prolong the life of the components.

In some embodiments, instead of the x megahertz RF generator, a y megahertz RF generator or a z megahertz RF generator is used. An example of the y megahertz RF generator is a 27 MHz RF generator and an example of the z megahertz RF generator is a 60 MHz RF generator. In various embodiments, instead of the x megahertz RF generator, a kHz RF generator, e.g., a 400 kHz RF generator, is used.

In various embodiments, instead of the digital pulsed signal 130 being generated by the processor 116, a digital clock source is used to generate the digital pulsed signal 130. The digital clock source is located within or outside the host computer 110.

In some embodiments in which the digital pulsed signal 130 has more than two states, multiple clock sources are used to generate the digital pulsed signal 130. For example, the clock signals from the multiple clock sources are summed, e.g., by a summer circuit, by the processor 116, etc., to generate the digital pulsed signal 130 having more than two states. The clock signals are out of phase from each other.

In various embodiments, the control signal is sent to control to the series circuit 102 but not the shunt circuit 104 until the reflected power is reduced at the output 136 for the states S(n–N) through S(n). In various embodiments, the control signal is sent to control to the shunt circuit 104 but not the series circuit 102 until the reflected power is reduced at the output 136 for the states S(n–N) through S(n).

In some embodiments, a sensor, as described herein, is coupled to an output of an RF generator and is located outside the RF generator.

In several embodiments, the terms minima and minimum are used interchangeably herein.

Figure 1B:
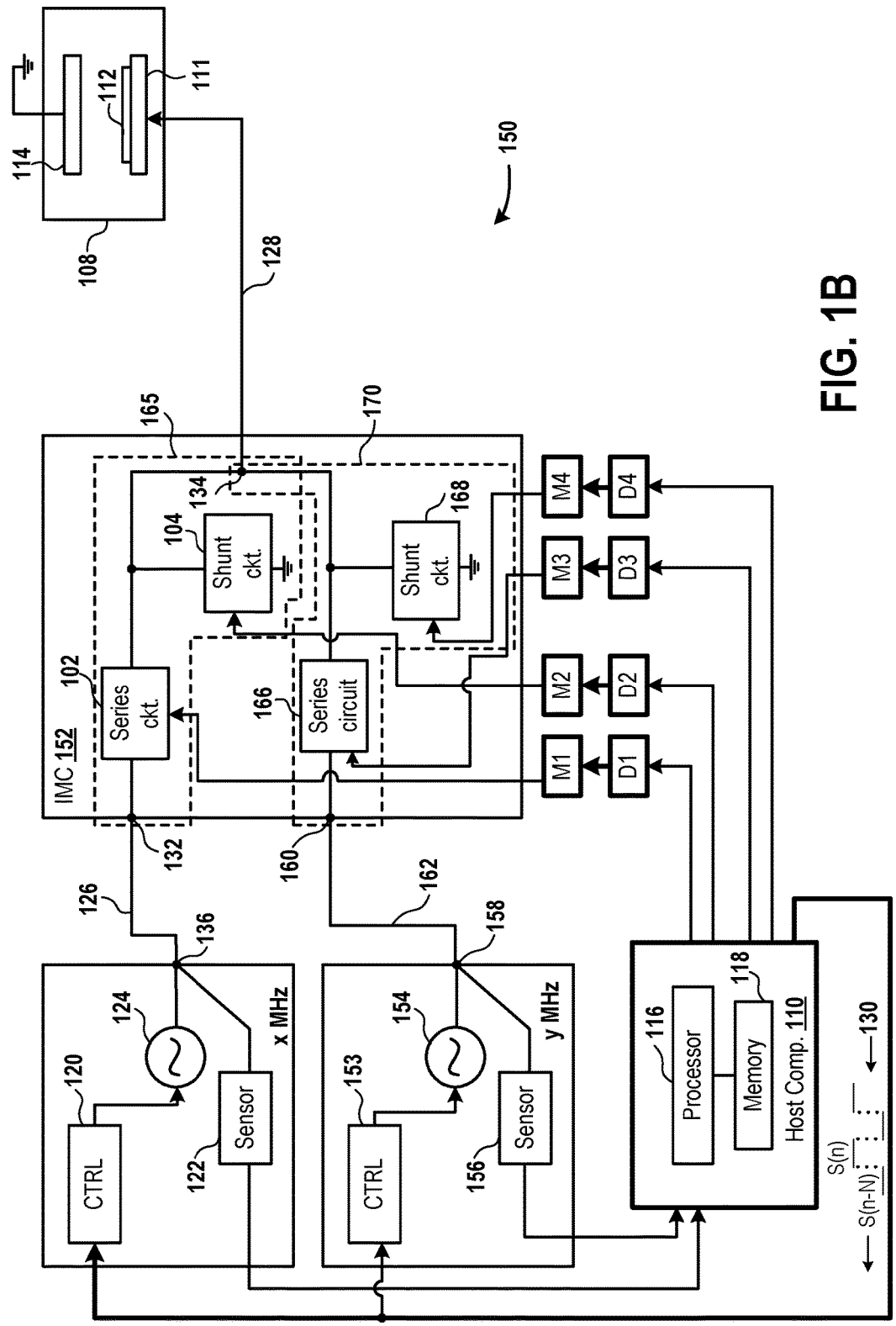
FIG. 1B is a diagram of an embodiment of a system for illustrating a reduction in reflected power towards the x MHz RF generator and a reduction in reflected power towards a y MHz RF generator for the states S(n–N) through S(n).

FIG. 1B is a diagram of an embodiment of a system 150 for illustrating a reduction in reflected power towards the x MHz RF generator and the y MHz RF generator for the states S(n–N) through S(n). The system 150 includes the x MHz RF generator, the y MHz RF generator, the host computer 110, an impedance matching circuit 152, the plasma chamber 108, the motors M1 and M2, the drivers D1 and D2, a motor M3, a motor M4, a driver D3, and a driver D4. The impedance matching circuit 152 includes a series circuit 166 and a shunt circuit 168 coupled to each other. The impedance matching circuit 152 also includes the series circuit 102 and the shunt circuit 104.

An output 158 of the y MHz RF generator is coupled to an input 160 of the impedance matching circuit 152 via an RF cable 162. The y MHz RF generator includes a control system 153, an RF power supply 154, and a sensor 156. The sensor 156 is coupled to the output 158 of the y MHz RF generator. Moreover, the sensor 156 is coupled to the processor 116 via a data cable and the processor 116 is coupled to the control system 153 via a data cable.

The processor 116 is coupled to the driver D3, which is coupled to the motor M3. The motor M3 is coupled via one or more connection mechanisms to the series circuit 166. Moreover, the processor 116 is coupled to the driver D4, which is coupled to the motor M4. The motor M4 is coupled via one or more connection mechanisms to the shunt circuit 168.

An end of the series circuit 166 is coupled to the input 160 and another end of the series circuit 166 is coupled to the output 134. Moreover, an end of the shunt circuit 168 is coupled to the series circuit 166 and the output 134 of the impedance matching circuit 152 and another end of the shunt circuit 168 is coupled to the ground.

The processor 116 sends the digital pulsed signal 130 via the data cable to the control system 153 of the y MHz RF generator. Upon receiving the digital pulsed signal 130, the control system 153 provides a power level and a frequency level for the state S(n–N) to the RF power supply 154 in a manner described above in which the control system 120 of the x MHz RF generator provides a power level and a frequency level for the state S(n–N) to the RF power supply 124 of the x MHz RF generator. The RF power supply 154 generates an RF signal having the power level and the frequency level for the state S(n–N) in a manner in which the RF power supply 124 of the x MHz RF generator generates its RF signal having the power level and the frequency level for the state S(n–N). The RF power supply 154 supplies the RF signal via the RF cable 162 to the input 160 of the impedance matching circuit 152.

Similarly, upon receiving the digital pulsed signal 130, the control system 153 provides a power level and a frequency level for the state S(n) to the RF power supply 154 in a manner described above in which the control system 120 of the x MHz RF generator provides a power level and a frequency level for the state S(n) to the RF power supply 124 of the x MHz RF generator. The RF power supply 154 generates an RF signal having the power level and the frequency level for the state S(n) in a manner in which the RF power supply 124 of the x MHz RF generator generates its RF signal having the power level and the frequency level for the state S(n). The RF power supply 154 supplies the RF signal via the RF cable 162 to the input 160 of the impedance matching circuit 152.

When the RF signal for the state S(n–N) is received from the y MHz RF generator by the impedance matching circuit 152 in addition to the RF signal for the state S(n–N) from the x MHz RF generator, the impedance matching circuit 152 matches an impedance of a load, e.g., the RF transmission line 128 and the plasma chamber 108, that is coupled to the output 134 of the impedance matching circuit 152 with that of a source, e.g., the RF cable 126, the x megahertz RF generator, the RF cable 162 and the y MHz RF generator, that is coupled to the inputs 132 and 160 of the impedance matching circuit 152. The impedance matching circuit 152 matches the impedances and also combines, e.g., sums, the RF signals transferred via a branch circuit 165 and a branch circuit 170 of the impedance matching circuit 152 during the state S(n–N) to generate a modified RF signal for the state S(n–N) that is provided from the impedance matching circuit 152 via the output 134 and the RF transmission line 128 to the chuck 111. The circuit 165 includes the series circuit 102 and the shunt circuit 104.

Similarly, when the RF signal for the state S(n) is received from the y MHz RF generator by the impedance matching circuit 152 in addition to the RF signal for the state S(n) from the x MHz RF generator, the impedance matching circuit 152 matches an impedance of the load that is coupled to the output 134 of the impedance matching circuit 152 with that of the source that is coupled to the inputs 132 and 160 of the impedance matching circuit 152. The impedance matching circuit 152 matches the impedances and also combines, e.g., sums, the RF signals transferred via the branch circuit 165 and the branch circuit 170 of the impedance matching circuit 152 during the state S(n) to generate the modified RF signal for the state S(n) that is provided from the impedance matching circuit 152 via the output 134 and the RF transmission line 128 to the chuck 111. The substrate 112 is processed when the modified RF signal is received via the RF transmission line 128 from the impedance matching circuit 152 in addition to the one or more process gases.

During the state S(n–N), the sensor 156 that is coupled to the output 158 of the y MHz RF generator senses values of the variable, e.g., reflected power, at the output 158. The reflected power is power that is reflected towards the output 158 of the y MHz RF generator from the plasma of the plasma chamber 108 via the RF transmission line 128, the branch circuit 170 that includes the series circuit 166 and the shunt circuit 168, and the RF cable 162. Similarly, during the state S(n), the sensor 156 senses values of the variable reflected towards the output 158 of the y MHz RF generator.

Values of the variable sensed during the states S(n–N) through S(n), e.g., multiple occurrences of the states S(n–N) through S(n), are continuously provided from the sensor 156 to the processor 116 via the data cable. The processor 116 determines values of the one or more parameters of the one or more electrical components of the impedance matching circuit 152 from the variable sensed during the states S(n–N) through S(n) until the reflected power at the output 158 of the y MHz RF generator is simultaneously reduced for the states S(n–N) through S(n) compared to reflected power that is reduced at the output 158 for one of the states S(n–N) through S(n) but not for the other one(s) of the states S(n–N) through S(n). For example, the values of the one or more parameters are determined such that an amount of power reflected at the output 158 of the y MHz RF generator for all the states S(n–N) through S(n) is less than an amount of power reflected at the output 158 for any one of the states S(n–N) through S(n). To further illustrate, an amount of power PrA is reflected towards the output 158 of the y MHz RF generator during the state S1 when a value of a capacitance of the series circuit 166 is CA and a value of a capacitance of the shunt circuit 168 is CB. However, when the same values CA and CB are used for the state S2, an amount of power reflected towards the output 158 during the state S2 is PrB, which is substantially greater than PrA. When the values, e.g., a value CC of the parameter of the series circuit 166 and a value CD of the parameter of the shunt circuit 168, of one or more parameters of the one or more electrical components of the impedance matching circuit 152 are determined from the variable sensed by the sensor 156 during the states S(n–N) through S(n) so that the reflected power at the output 158 is simultaneously reduced for the states S(n–N) through S(n), the reflected power is of an amount PrC. The value PrC is less than the value PrB but is greater than the value PrA. In some embodiments, the value PrC is equal to or less than the value PrA.

As another illustration, when the values, e.g., the value CC of the parameter of the series circuit 166 and the value CD of the parameter of the shunt circuit 168, of one or more parameters of the impedance matching circuit 152 are determined from the variable sensed during the states S(n–N) through S(n) so that the reflected power is simultaneously reduced for the states S(n–N) through S(n), the reflected power is of an amount PrD for the state S(n–N) and is of an amount PrE for the state S(n). The value PrD is a minima for the state S(n–N) among values of reflected power for the state S(n–N). The values of the reflected power for the state S(n–N) are achieved when a frequency of the y MHz RF generator and/or power of the RF signal supplied by the y MHz RF generator is varied during the state S(n–N). The value PrD is a minima for the state S(n) among values of reflected power for the state S(n). The values of the reflected power for the state S(n) are achieved when a frequency of the y MHz RF generator and/or power of the RF signal supplied by the y MHz RF generator is varied during the state S(n). In various embodiments, the minima for the state S(n–N) is within the pre-determined threshold of the minima for the state S(n). In some embodiments, the minima for the state S(n–N) is within the pre-determined threshold of the minima for the state S(n) and both the minimas are lower than the pre-determined level of reflected power. The value PrB is greater than the pre-determined level and the value PrA is less than the pre-determined level.

During the states S(n–N) through S(n), the processor 116 sends and continues to send a control signal to the driver D3 indicating a value of the parameter for the states S(n–N) through S(n) until the reflected power is reduced at the output 158 of the y MHz RF generator for the states S(n–N) through S(n). Upon receiving the control signal, motor M3 rotates to change a value of the parameter of the series circuit 166 via the one or more connection mechanisms that couple the motor M3 to the series circuit 166. Similarly, during the states S(n–N) through S(n), the processor 116 sends and continues to send a control signal to the driver D4 indicating a value of the parameter for the states S(n–N) through S(n) until the reflected power is reduced at the output 158 for the states S(n–N) through S(n). Upon receiving the control signal, motor M4 rotates to change a value of the parameter of the shunt circuit 168 via the one or more connection mechanisms that couple the motor M4 to the shunt circuit 168. The reduction in the reflected power at the output 158 also increases a life of the y MHz RF generator.

In some embodiments, the processor 116 simultaneously controls the values of the one or more parameters of one or more of the series circuit 102, the shunt circuit 104, the series circuit 166, and the shunt circuit 168 until the reflected power at the output 158 is reduced for the states S(n–N) through S(n) to a level that is within a pre-determined range from a level to which the reflected power is reduced at the output 136 for the states S(n–N) through S(n). For example, the value PrC at the output 158 is within the pre-determined range from the value Pr3 of the reflected power at the output 136.

In various embodiments, the processor 116 simultaneously controls the values of the one or more parameters of one or more of the series circuit 102, the shunt circuit 104, the series circuit 166, and the shunt circuit 168 until the reflected power at the output 158 is reduced for the states S(n–N) through S(n) to a level that is within the pre-determined range from a level to which the reflected power is reduced at the output 136 for the states S(n–N) through S(n). In addition, the processor 116 simultaneously controls the values of the one or more parameters of one or more of the series circuit 102, the shunt circuit 104, the series circuit 166, and the shunt circuit 168 until the reflected power at the output 136 and the reflected power at the output 158 are less than a pre-determined limit. For example, the value PrC at the output 158 is within the pre-determined range from the value Pr3 of the reflected power at the output 136 and the values PrC and Pr3 are less than the pre-determined limit of reflected power. The pre-determined range and the pre-determined limit are stored in the memory device 118 for access by the processor 116.

In several embodiments, the processor 116 simultaneously controls the values of the one or more parameters of one or more of the series circuit 102, the shunt circuit 104, the series circuit 166, and the shunt circuit 168 until the reflected power at the output 158 is reduced for the state S(n–N) to a level that is within the pre-determined range from a level to which the reflected power is reduced at the output 136 for the state S(n–N). Moreover, the processor 116 simultaneously controls the values of the one or more parameters of one or more of the series circuit 102, the shunt circuit 104, the series circuit 166, and the shunt circuit 168 until the reflected power at the output 158 is reduced for the state S(n) to a level that is within the pre-determined range from a level to which the reflected power is reduced at the output 136 for the state S(n). For example, the value PrD at the output 158 is within the pre-determined range from the value Pr4 of the reflected power at the output 136 and the value PrE at the output 158 is within the pre-determined range from the value Pr5 of the reflected power at the output 136.

In various embodiments, the processor 116 simultaneously controls the values of the one or more parameters of one or more of the series circuit 102, the shunt circuit 104, the series circuit 166, and the shunt circuit 168 until the reflected power at the output 158 is reduced for the state S(n–N) to a level that is within the pre-determined range from a level to which the reflected power is reduced at the output 136 for the state S(n–N). Moreover, the processor 116 simultaneously controls the values of the one or more parameters of one or more of the series circuit 102, the shunt circuit 104, the series circuit 166, and the shunt circuit 168 until the reflected power at the output 158 is reduced for the state S(n) to a level that is within the pre-determined range from a level to which the reflected power is reduced at the output 136 for the state S(n). In addition, the processor 116 simultaneously controls the values of the one or more parameters of one or more of the series circuit 102, the shunt circuit 104, the series circuit 166, and the shunt circuit 168 until the reflected power at the output 136 and the reflected power at the output 158 are less than the pre-determined limit. For example, the value PrD at the output 158 is within the pre-determined range from the value Pr4 of the reflected power at the output 136 and the values PrD and Pr4 are less than the pre-determined limit of reflected power. Moreover, the value PrE at the output 158 is within the pre-determined range from the value Pr5 of the reflected power at the output 136 and the values PrE and Pr5 are less than the pre-determined limit of reflected power.

Figure 1C:
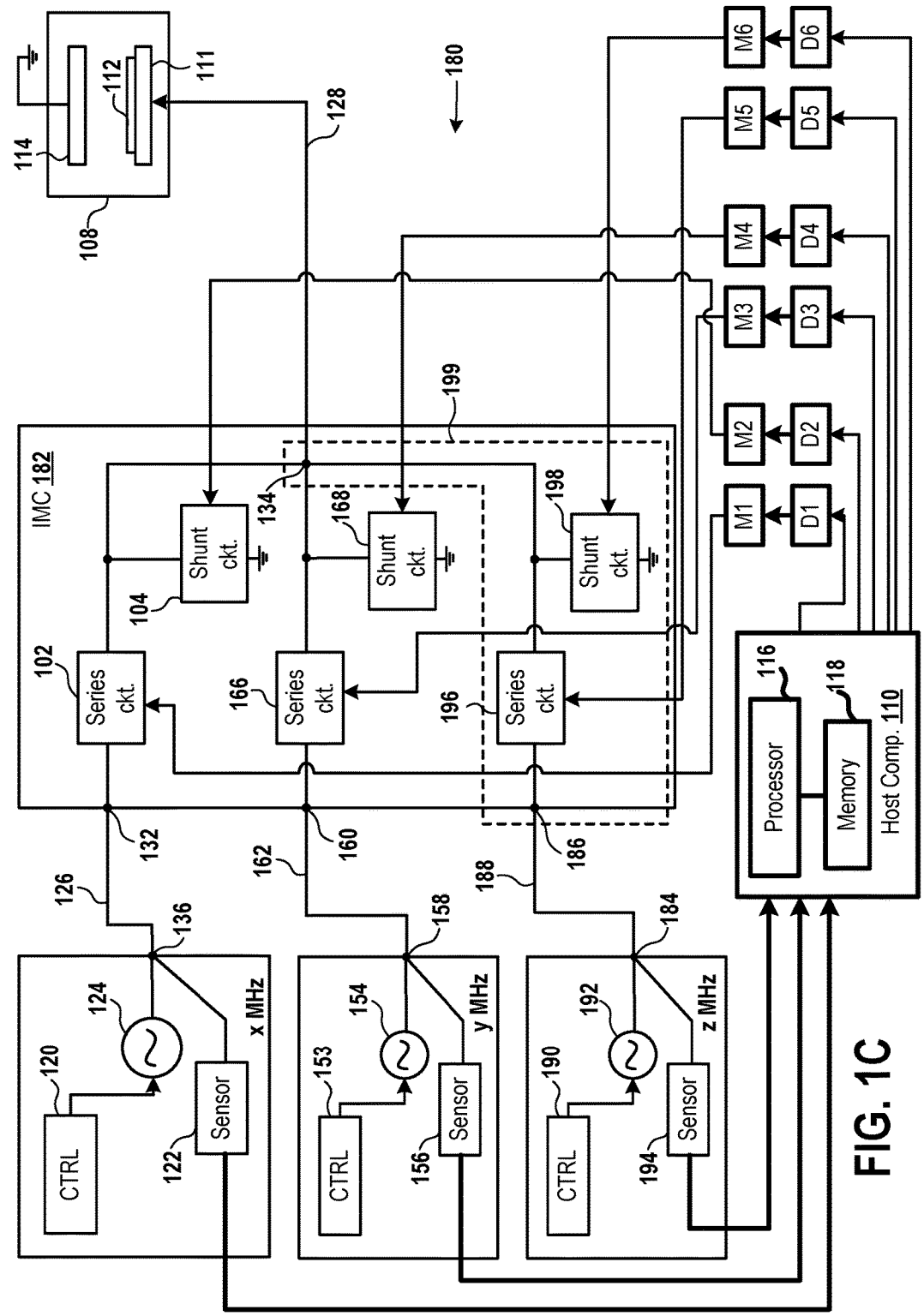
FIG. 1C is a diagram of an embodiment of a system for illustrating a reduction in reflected power towards the x MHz RF generator, a reduction in reflected power towards the y MHz RF generator, and a reduction in reflected power towards a z MHz RF generator for the states S(n–N) through S(n).

FIG. 1C is a diagram of an embodiment of a system 180 for illustrating a reduction in reflected power towards the x MHz RF generator, the y MHz RF generator, and the z MHz RF generator for the states S(n–N) through S(n). The system 180 includes the x MHz RF generator, the y MHz RF generator, the z MHz RF generator, the host computer 110, an impedance matching circuit 182, the plasma chamber 108, the motors M1 through M4, the drivers D1 through D4, a motor M5, a motor M6, a driver D5, and a driver D6. The impedance matching circuit 182 includes a series circuit 196 and a shunt circuit 198 coupled to each other.

An output 184 of the z MHz RF generator is coupled to an input 186 of the impedance matching circuit 182 via an RF cable 188. The z MHz RF generator includes a control system 190, an RF power supply 192, and a sensor 194. The sensor 194 is coupled to the output 184 of the z MHz RF generator. Moreover, the sensor 194 is coupled to the processor 116 via a data cable and the processor 116 is coupled to the control system 190 via a data cable.

The processor 116 is coupled to the driver D5, which is coupled to the motor M5. The motor M5 is coupled via one or more connection mechanisms to the series circuit 196. Moreover, the processor 116 is coupled to the driver D6, which is coupled to the motor M6. The motor M6 is coupled via one or more connection mechanisms to the shunt circuit 198.

The impedance matching circuit 182 includes the series circuit 102, the shunt circuit 104, the series circuit 164, the shunt circuit 166, the series circuit 196, and the shunt circuit 198. An end of the series circuit 196 is coupled to the input 186 and another end of the series circuit 196 is coupled to the output 134. Moreover, an end of the shunt circuit 198 is coupled to the series circuit 196 and the output 134 of the impedance matching circuit 182 and another end of the shunt circuit 198 is coupled to ground.

The processor 116 sends the digital pulsed signal 130 via the data cable to the control system 190 of the z MHz RF generator. Upon receiving the digital pulsed signal 130, the control system 190 provides a power level and a frequency level for the state S(n–N) to the RF power supply 192 in a manner described above in which the control system 120 of the x MHz RF generator provides a power level and a frequency level for the state S(n–N) to the RF power supply 124 of the x MHz RF generator. The RF power supply 192 generates an RF signal having the power level and the frequency level for the state S(n–N) in a manner in which the RF power supply 124 of the x MHz RF generator generates its RF signal having the power level and the frequency level for the state S(n–N). The RF power supply 192 supplies the RF signal via the RF cable 188 to the input 186 of the impedance matching circuit 182.

Similarly, upon receiving the digital pulsed signal 130, the control system 190 provides a power level and a frequency level for the state S(n) to the RF power supply 192 in a manner described above in which the control system 120 of the x MHz RF generator provides a power level and a frequency level for the state S(n) to the RF power supply 124 of the x MHz RF generator. The RF power supply 192 generates an RF signal having the power level and the frequency level for the state S(n) in a manner in which the RF power supply 124 of the x MHz RF generator generates its RF signal having the power level and the frequency level for the state S(n). The RF power supply 192 supplies the RF signal via the RF cable 162 to the input 186 of the impedance matching circuit 182.

When the RF signal for the state S(n–N) is received from the z MHz RF generator by the impedance matching circuit 182 in addition to the RF signals for the state S(n–N) from the x and y MHz RF generators, the impedance matching circuit 182 matches an impedance of a load, e.g., the RF transmission line 128 and the plasma chamber 108, that is coupled to the output 134 of the impedance matching circuit 182 with that of a source, e.g., the RF cable 126, the x megahertz RF generator, the RF cable 162, the y MHz RF generator, the RF cable 188, and the z MHz RF generator, that is coupled to the inputs 132, 160, and 186 of the impedance matching circuit 182. The impedance matching circuit 182 matches the impedances and combines the RF signals sent via the branch circuits 165 (FIG. 1B), 170, and 199 to generate a modified RF signal for the state S(n–N). The modified RF signal for the state S(n–N) is provided from the impedance matching circuit 182 via the output 134 and the RF transmission line 128 to the chuck 111. The branch circuit 199 includes the series circuit 196 and the shunt circuit 198.

Similarly, when the RF signal for the state S(n) is received from the z MHz RF generator by the impedance matching circuit 182 in addition to the RF signals for the state S(n) from the x and y MHz RF generators, the impedance matching circuit 182 matches an impedance of the load that is coupled to the output 134 of the impedance matching circuit 182 with that of the source that is coupled to the inputs 132, 160, and 186 of the impedance matching circuit 182. The impedance matching circuit 182 matches the impedances and combines the RF signals sent via the branch circuits 165 (FIG. 1B), 170, and 199 to generate the modified RF signal for the state S(n). The modified RF signal for the state S(n) is provided from the impedance matching circuit 182 via the RF transmission line 128 to the chuck 111. The substrate 112 is processed when the modified RF signal is received via the RF transmission line 128 from the impedance matching circuit 182 in addition to the one or more process gases.

During the state S(n–N), the sensor 194 that is coupled to the output 184 of the z MHz RF generator senses values of the variable, e.g., reflected power, at the output 184. The reflected power is power that is reflected towards the output 184 of the z MHz RF generator from the plasma of the plasma chamber 108 via the RF transmission line 128, the branch circuit 199 of the impedance matching circuit 182, and the RF cable 188. Similarly, during the state S(n), the sensor 194 senses values of the variable reflected towards the output 184 of the z MHz RF generator.

Values of the variable sensed during the states S(n–N) through S(n), e.g., multiple occurrences of the states S(n–N) through S(n), are continuously provided from the sensor 194 to the processor 116 via the data cable. The processor 116 determines values of the one or more parameters of the one or more electrical components of the impedance matching circuit 182 from the variable sensed during the states S(n–N) through S(n) until the reflected power at the output 184 is simultaneously reduced for the states S(n–N) through S(n) compared to reflected power that is reduced at the output 184 for one of the states S(n–N) through S(n) but not for the other one(s) of the states S(n–N) through S(n). For example, the values of the one or more parameters are determined such that an amount of power reflected at the output 184 for all the states S(n–N) through S(n) is reduced compared to an amount of power reflected at the output 184 that is reduced for any one of the states S(n–N) through S(n) but not for the remaining of the states S(n–N) through S(n). To further illustrate, an amount of power Pra is reflected towards the output 184 during the state S1 when a value of a capacitance of the series circuit 196 is Ca and a value of a capacitance of the shunt circuit 198 is Cb. However, when the same values Ca and Cb are used for the state S2, an amount of power reflected towards the output 184 during the state S2 is Prb, which is substantially greater than Pra. When the values, e.g., a value Cc of the parameter of the series circuit 196 and a value Cd of the parameter of the shunt circuit 198, of one or more parameters of the one or more electrical components of the impedance matching circuit 182 are determined from the variable sensed by the sensor 194 during the states S(n–N) and S(n) so that the reflected power at the output 184 is simultaneously reduced for the states S(n–N) and S(n), the reflected power is of an amount Prc. The value Prc is less than the value Prb but is greater than the value Pra. In some embodiments, the value Prc is equal to or less than the value Pra.

As another illustration, when the values, e.g., the value Cc of the parameter of the series circuit 196 and the value Cd of the parameter of the shunt circuit 198, of one or more parameters of the impedance matching circuit 182 are determined from the variable sensed during the states S(n–N) through S(n) so that the reflected power is simultaneously reduced for the states S(n–N) through S(n), the reflected power is of an amount Prd for the state S(n–N) and is of an amount Pre for the state S(n). The value Prd is a minima for the state S(n–N) among values of reflected power for the state S(n–N). The values of the reflected power for the state S(n–N) are achieved when a frequency of the z MHz RF generator and/or power of the RF signal supplied by the z MHz RF generator is varied during the state S(n–N). The value Prd is a minima for the state S(n) among values of reflected power for the state S(n). The values of the reflected power for the state S(n) are achieved when a frequency of the z MHz RF generator and/or power of the RF signal supplied by the z MHz RF generator is varied during the state S(n). In various embodiments, the minima for the state S(n–N) is within the pre-determined threshold of the minima for the state S(n). In some embodiments, the minima for the state S(n–N) is within the pre-determined threshold of the minima for the state S(n) and both the minimas are lower than the pre-determined level of reflected power. The value Prb is greater than the pre-determined level and the value Pra is less than the pre-determined level.

During the states S(n–N) through S(n), the processor 116 sends and continues to send a control signal to the driver D5 indicating a value of the parameter for the states S(n–N) through S(n) until the reflected power is reduced at the output 184 of the z MHz RF generator for the states S(n–N) through S(n). Upon receiving the control signal, the motor M5 rotates to change a value of the parameter of the series circuit 196 via the one or more connection mechanisms that couple the motor M5 to the series circuit 196. Similarly, during the states S(n–N) through S(n), the processor 116 sends and continues to send a control signal to the driver D6 indicating a value of the parameter for the states S(n–N) through S(n) until the reflected power is reduced at the output 184 for the states S(n–N) through S(n). Upon receiving the control signal, motor M6 rotates to change a value of the parameter of the shunt circuit 198 via the one or more connection mechanisms that couple the motor M6 to the shunt circuit 198. The reduction in the reflected power at the output 184 also increases a life of the z MHz RF generator.

In some embodiments, the processor 116 simultaneously controls the values of the one or more parameters of one or more of the series circuit 102, the shunt circuit 104, the series circuit 166, the shunt circuit 168, the series circuit 196, and the shunt circuit 198 until the reflected power at the output 184 is reduced for the states S(n–N) through S(n) to a level that is within the pre-determined range from a level to which the reflected power is reduced at the output 136 for the states S(n–N) through S(n) and from a level to which the reflected power is reduced at the output 158 for the states S(n–N) through S(n). For example, the value Prc at the output 184 is within the pre-determined range from the value Pr3 of the reflected power at the output 136 and from the value PrC of the reflected power at the output 158.

In various embodiments, the processor 116 simultaneously controls the values of the one or more parameters of one or more of the series circuit 102, the shunt circuit 104, the series circuit 166, the shunt circuit 168, the series circuit 196, and the shunt circuit 198 until the reflected power at the output 184 is reduced for the states S(n–N) through S(n) to a level that is within the pre-determined range from a level to which the reflected power is reduced at the output 136 for the states S(n–N) through S(n) and from a level to which the reflected power is reduced at the output 158 for the states S(n–N) through S(n). In addition, the processor 116 simultaneously controls the values of the one or more parameters of one or more of the series circuit 102, the shunt circuit 104, the series circuit 166, the shunt circuit 168, the series circuit 196, and the shunt circuit 198 until the reflected power at the output 136, the reflected power at the output 158, and the reflected power at the output 184 are less than the pre-determined limit. For example, the value PrC at the output 158 is within the pre-determined range from the value Pr3 of the reflected power at the output 136 and from the value Prc at the output 184, and the values PrC, Pr3, and Prc are less than the pre-determined limit of reflected power.

In some embodiments, the processor 116 simultaneously controls the values of the one or more parameters of one or more of the series circuit 102, the shunt circuit 104, the series circuit 166, the shunt circuit 168, the series circuit 196, and the shunt circuit 198 until the reflected power at the output 184 is reduced for the state S(n–N) to a level that is within the pre-determined range from a level to which the reflected power is reduced at the output 136 for the state S(n–N) and from a level to which the reflected power is reduced at the output 158 for the state S(n–N). Moreover, the processor 116 simultaneously controls the values of the one or more parameters of one or more of the series circuit 102, the shunt circuit 104, the series circuit 166, the shunt circuit 168, the series circuit 196, and the shunt circuit 198 until the reflected power at the output 184 is reduced for the state S(n) to a level that is within the pre-determined range from a level to which the reflected power is reduced at the output 136 for the state S(n) and from a level to which the reflected power is reduced at the output 158 for the state S(n). For example, the value Prd at the output 184 is within the pre-determined range from the value Pr4 of the reflected power at the output 136 and from the value PrD of the reflected power at the output 158. Also, the value Pre at the output 184 is within the pre-determined range from the value Pr5 of the reflected power at the output 136 and from the value PrE of the reflected power at the output 158.

In various embodiments, the processor 116 simultaneously controls the values of the one or more parameters of one or more of the series circuit 102, the shunt circuit 104, the series circuit 166, the shunt circuit 168, the series circuit 196, and the shunt circuit 198 until the reflected power at the output 184 is reduced for the state S(n–N) to a level that is within the pre-determined range from a level to which the reflected power is reduced at the output 136 for the state S(n–N) and from a level to which the reflected power is reduced at the output 158 for the state S(n–N). Moreover, the processor 116 simultaneously controls the values of the one or more parameters of one or more of the series circuit 102, the shunt circuit 104, the series circuit 166, the shunt circuit 168, the series circuit 196, and the shunt circuit 198 until the reflected power at the output 184 is reduced for the state S(n) to a level that is within the pre-determined range from a level to which the reflected power is reduced at the output 136 for the state S(n) and from a level to which the reflected power is reduced at the output 158 for the state S(n). In addition, the processor 116 simultaneously controls the values of the one or more parameters of one or more of the series circuit 102, the shunt circuit 104, the series circuit 166, the shunt circuit 168, the series circuit 196, and the shunt circuit 198 until the reflected power at the output 136, the reflected power at the output 158, and the reflected power at the output 184 are less than the pre-determined limit. For example, the value Prd at the output 184 is within the pre-determined range from the value Pr4 of the reflected power at the output 136 and from the value PrD of the reflected power at the output 158. Also, the value Pre at the output 184 is within the pre-determined range from the value Pr5 of the reflected power at the output 136 and from the value PrE of the reflected power at the output 158. All the values Prd, Pr4, PrD, Pre, Pr5, and PrE are less than the pre-determined limit.

In some embodiments, each circuit component, e.g., inductor, capacitor, etc. of an impedance matching circuit, described herein, is electronically controlled. For example, a motor is not used to control the circuit component.

Figure 2A:
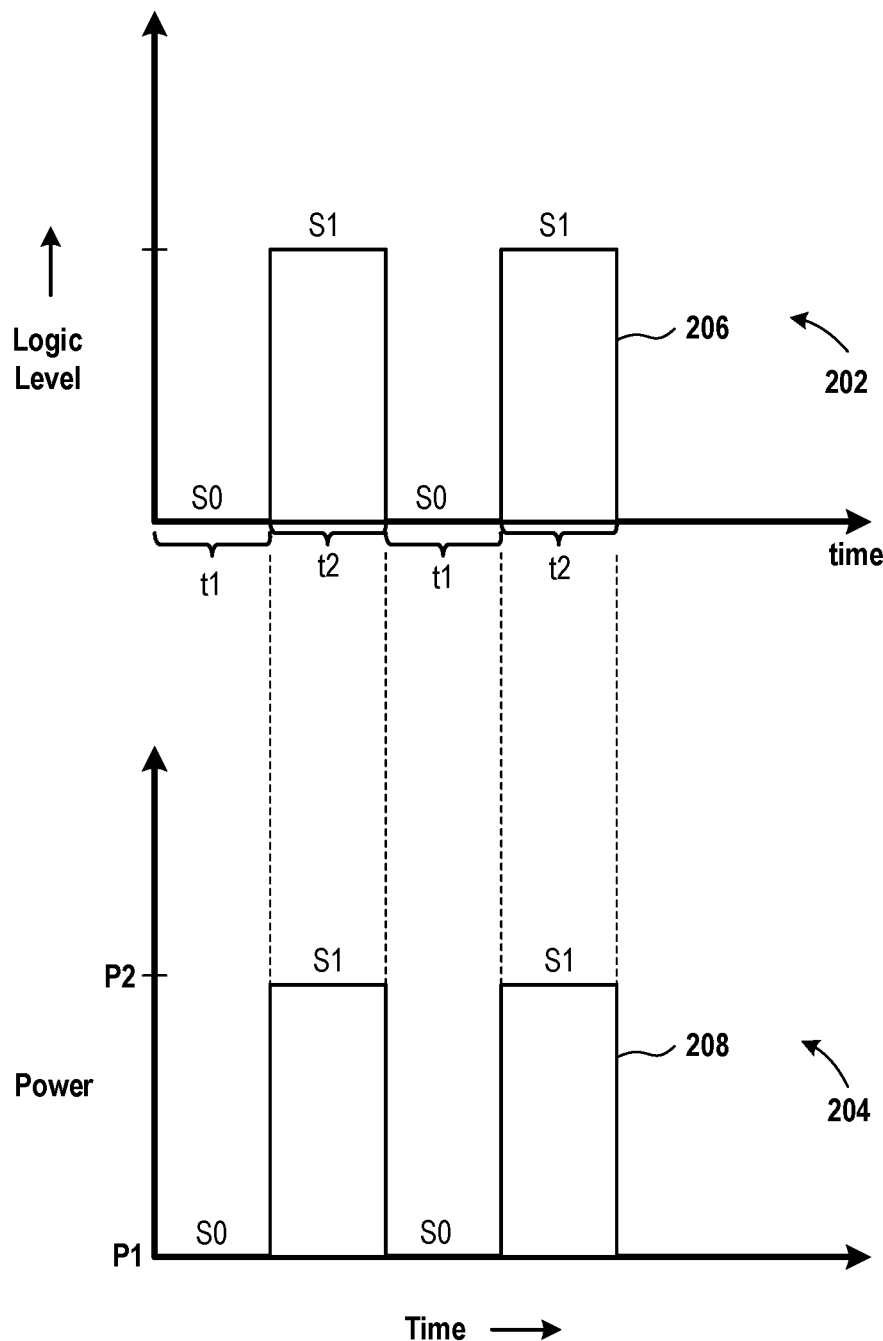
FIG. 2A is a diagram to illustrate an embodiment of a graph of a digital pulsed signal and a graph of an RF signal supplied by an RF generator to illustrate two states of an RF signal.

FIG. 2A is a diagram to illustrate an embodiment of a graph 202 of a digital pulsed signal 206 and a graph 204 to illustrate an embodiment of an RF signal 208 supplied by an RF generator, e.g., the x MHz RF generator, or the y MHz RF generator, or the z MHz RF generator. The digital pulsed signal 206 is an example of the digital pulsed signal 130 (FIGS. 1A-1C). The graph 202 plots a logic level versus time. Moreover, the graph 204 plots a power level of the RF signal 208 versus time. As an example, a power level of an RF signal is an envelope, e.g., a zero-to-peak amplitude, etc., of the RF signal. As another example, a power level of an RF signal is a root mean square value of amplitudes of the RF signal.

During the state S0, when the logic level of the digital pulsed signal 206 is zero, a power level of the RF signal 208 is P1, which is zero or a positive amount. Moreover, during the state S1, when the logic level of the digital pulsed signal 206 is one, a power level of the RF signal 208 is P2. The power level P2 is greater than the power level P1. Also, at a time the digital pulsed signal 206 transitions from the state S0 to the state S1, the RF signal 208 transitions from the power level P1 to the power level P2. At a time the digital pulsed signal 206 transitions from the state S1 to the state S0, the RF signal 208 transitions from the power level P2 to the power level P1. As such, the digital pulsed signal 206 is synchronized with the RF signal 208.

It should be noted that the state S0 of the digital pulsed signal 206 occurs for a time period t1 of a clock cycle. Moreover, the state S1 of the digital pulsed signal 206 occurs for a time period t2 of a clock cycle.

Figure 2B:
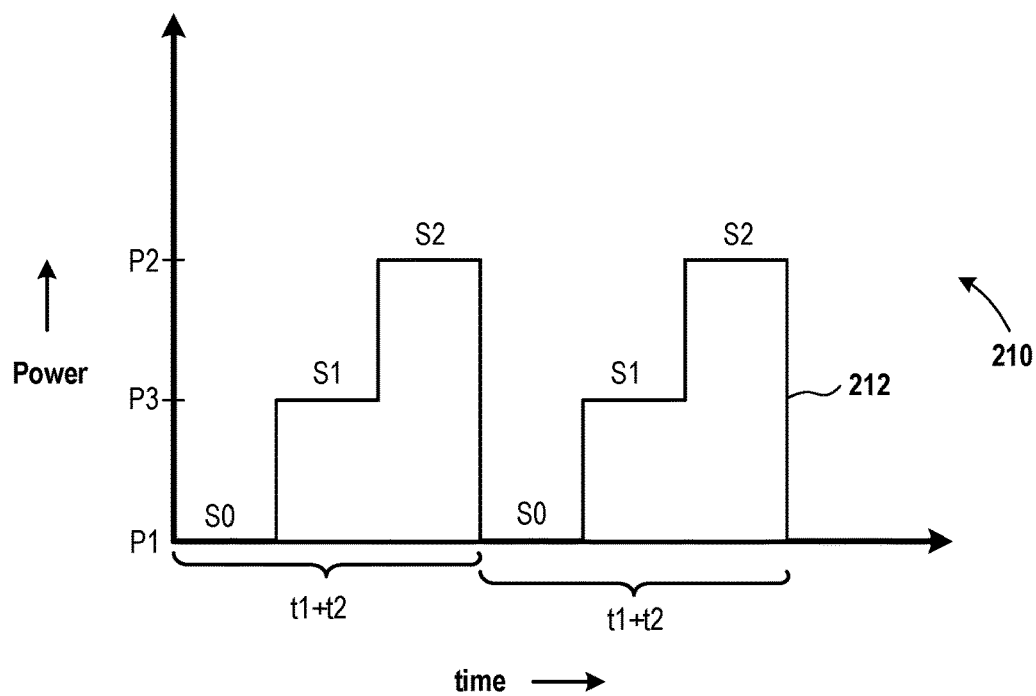
FIG. 2B is an embodiment of a graph to illustrate an RF signal having three states.

FIG. 2B is an embodiment of a graph 210 to illustrate an RF signal 212 having three states S0, S1, and S2. The RF signal 212 is an example of the RF signal that is supplied by the x MHz RF generator or the y MHz RF generator or the z MHz RF generator. During the state S0, the RF signal 212 has the power level P1. Moreover, during the state S1, the RF signal 212 has a power level P3. Also, during the state S2, the RF signal 212 has the power level P2. The power level P3 is lower than the power level P2 but is greater than the power level P1. At a time the digital pulsed signal 130 (FIGS. 1A-1C) transitions from the state S0 to the state S1, the RF signal 212 transitions from the power level P1 to the power level P3. Moreover, at a time the digital pulsed signal 130 transitions from the state S1 to the state S2, the RF signal 212 transitions from the power level P3 to the power level P2. Also, at a time the digital pulsed signal 130 transitions from the state S2 back to the state S0, the RF signal 212 transitions back to the power level P1 from the power level P2. The states S0 through S2 of the RF signal 212 occur during the clock cycle that is a sum of the time periods t1 and t2.

Figure 2C:
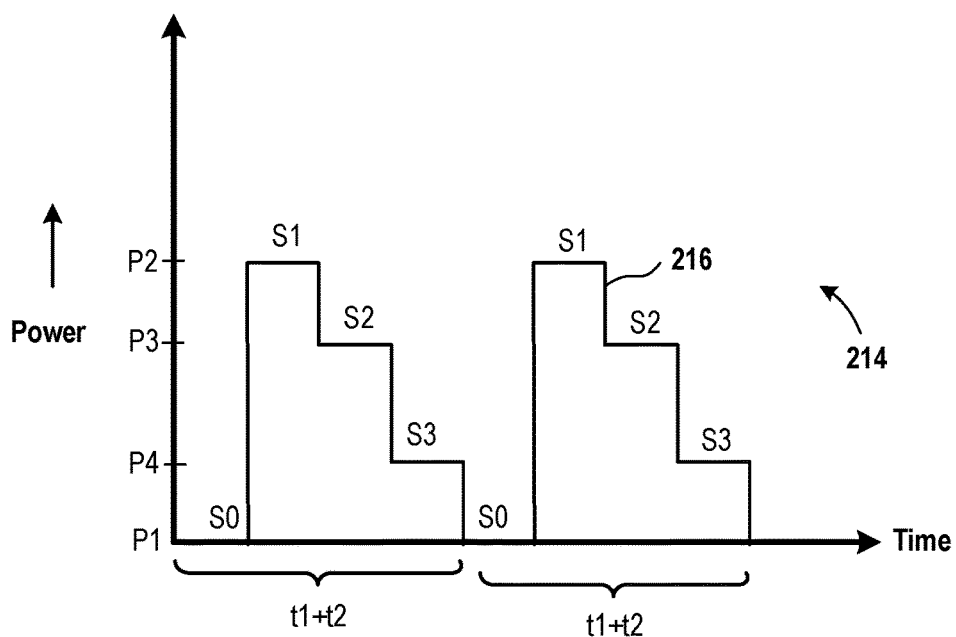
FIG. 2C is an embodiment of a graph to illustrate an RF signal having four states.

FIG. 2C is an embodiment of a graph 214 to illustrate an RF signal 216 having four states S0, S1, S2, and S3. The RF signal 216 is an example of the RF signal that is supplied by the x MHz RF generator or the y MHz RF generator or the z MHz RF generator. During the state S0, the RF signal 216 has the power level P1. Moreover, during the state S1, the RF signal 216 has the power level P2. Also, during the state S2, the RF signal 216 has the power level P3. During the state S3, the RF signal 216 has a power level P4. The power level P4 is lower than the power level P3 but is greater than the power level P1. At a time the digital pulsed signal 130 (FIGS. 1A-1C) transitions from the state S0 to the state S1, the RF signal 216 transitions from the power level P1 to the power level P2. Moreover, at a time the digital pulsed signal 130 transitions from the state S1 to the state S2, the RF signal 216 transitions from the power level P2 to the power level P3. Also, at a time the digital pulsed signal 130 transitions from the state S2 to the state S3, the RF signal 216 transitions from the power level P3 to the power level P4. Moreover, at a time the digital pulsed signal 130 transitions from the state S3 back to the state S0, the RF signal 216 transitions back to the power level P1 from the power level P4. The states S0 through S3 of the RF signal 216 occur during the clock cycle that is a sum of the time periods t1 and t2.

Figure 3A:
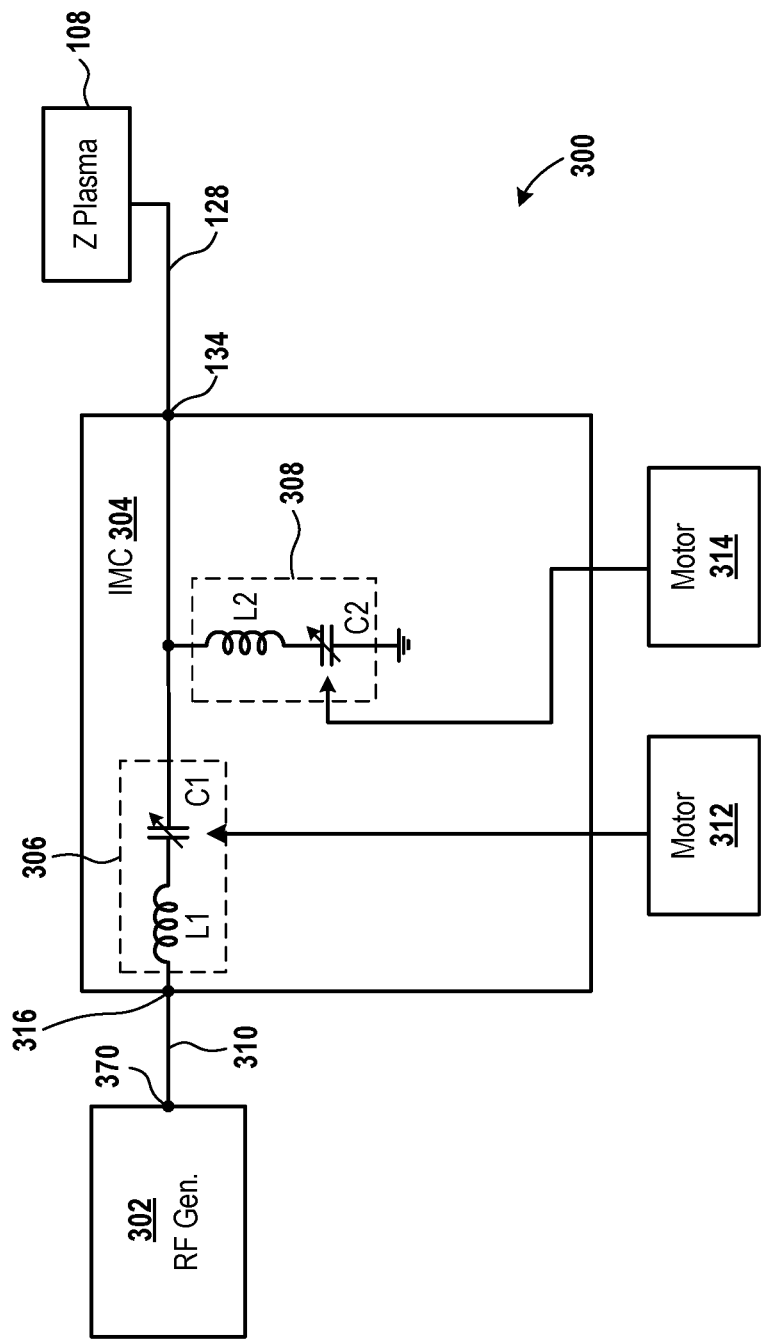
FIG. 3A is a diagram of an embodiment of a system to illustrate a control of a series circuit and a shunt circuit of an impedance matching circuit during the states S(n–N) through S(n).

FIG. 3A is a diagram of an embodiment of a system 300 to illustrate a control of a series circuit 306 and a shunt circuit 308 during the states S(n–N) through S(n). The series circuit 306 is an example of the series circuit 102, 166, or 196 (FIG. 1C). Moreover, the shunt circuit 308 is an example of the shunt circuit 104, 168, or 198 (FIG. 1C). The system 300 includes an RF generator 302, such as, the x MHz RF generator, or the y MHz RF generator, or the z MHz RF generator. The RF generator 302 has an output 370, which is an example of the output 136, or the output 158, or the output 184 (FIG. 1C). Moreover, the system 300 includes an impedance matching circuit 304, which is an example of the impedance matching circuit 106 (FIG. 1), or the branch circuit 170 (FIG. 1B), or the branch circuit 199 (FIG. 1C).

The RF generator 302 is coupled to the impedance matching circuit 304 via an RF cable 310, which is an example of the RF cable 126, or the RF cable 162, or the RF cable 188 (FIG. 1C). The output 134 of the impedance matching circuit 304 is coupled to the plasma chamber 108 via the RF transmission line 128.

The system 300 further includes a motor 312 and a motor 314. The motor 312 is an example of the motor M1, or the motor M3, or the motor M5 (FIG. 1C). Moreover, the motor 314 is an example of the motor M2, or the motor M4, or the motor M6 (FIG. 1C).

The series circuit 306 is coupled to the RF cable 310 via an input 316 of the impedance matching circuit 304. The input 316 is an example of the input 132, or the input 160, or the input 186 (FIG. 1C). The series circuit includes an inductor L1 in series with a capacitor C1, which is variable. An end of the inductor L1 is coupled to the input 316 and another end of the inductor L1 is coupled to the capacitor C1. The shunt circuit 308 includes an inductor L2 in series with a capacitor C2, which is also variable. An end of the inductor L2 is coupled to the output 134, which is coupled to an end of the capacitor C1. Moreover, another end of the inductor L2 is coupled to the capacitor C2, which is coupled to the ground at its other end. The inductors L and L2 are not variable and are fixed.

The motor 312 is coupled via the one or more connection mechanisms to the capacitor C1 and rotates to change a distance or an area between parallel plates of the capacitor C1. For example, plates of a capacitor move, e.g., rotate, with respect to each other to change a distance or an area between the plates. The change in the distance or the area changes, e.g., increases or decreases, a capacitance of the capacitor. Similarly, the motor 314 is coupled via the one or more connection mechanisms to the capacitor C2 and rotates to change a distance or an area between parallel plates of the capacitor C2.

Figure 3B:
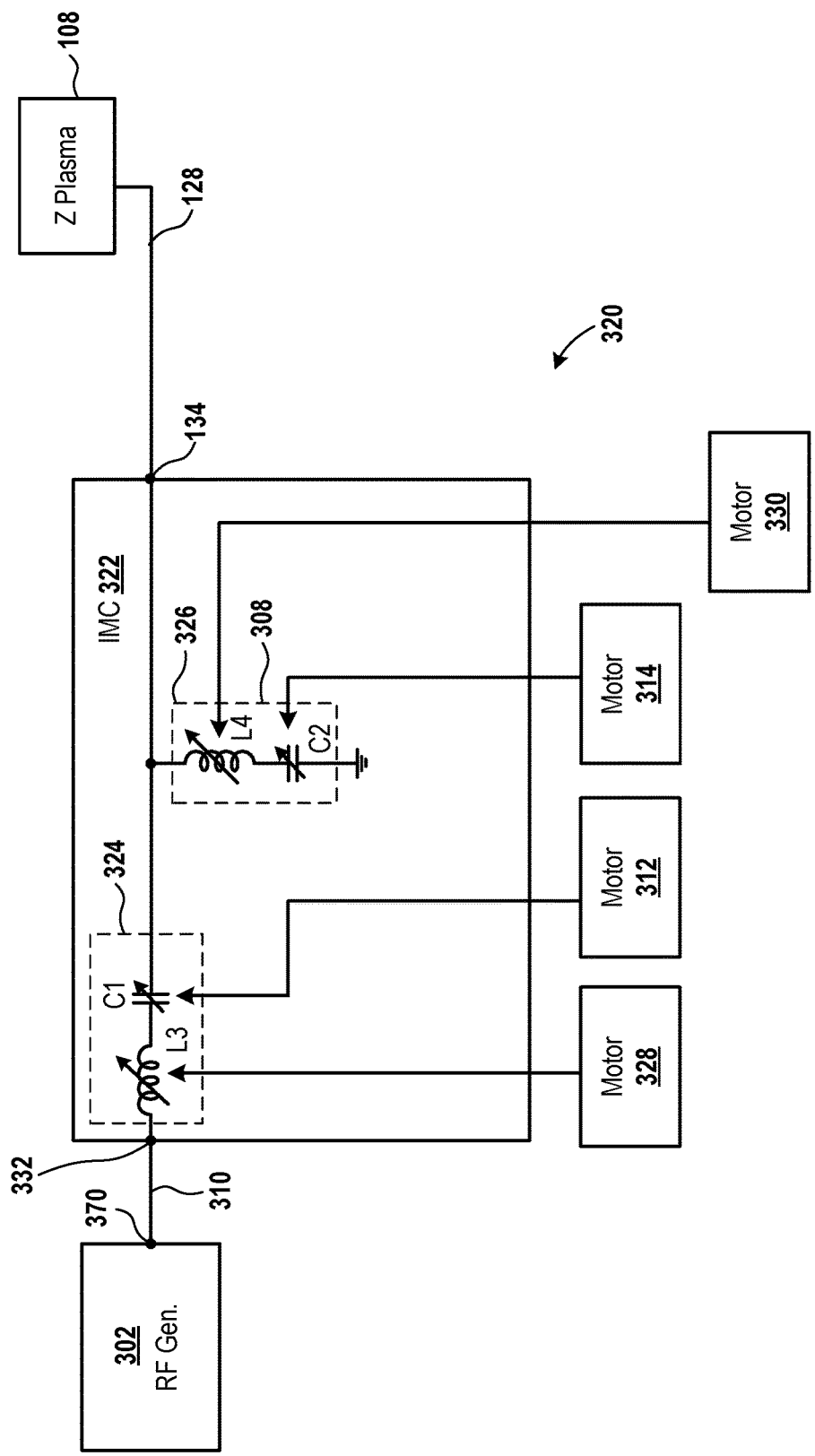
FIG. 3B is a diagram of an embodiment of a system to illustrate a control of a series circuit and a shunt circuit during the states S(n–N) through S(n).

FIG. 3B is a diagram of an embodiment of a system 320 to illustrate a control of a series circuit 324 and a shunt circuit 326 during the states S(n–N) through S(n). The series circuit 324 is an example of the series circuit 102, 166, or 196 (FIG. 1C). Moreover, the shunt circuit 326 is an example of the shunt circuit 104, 168, or 198 (FIG. 1C). The system 320 includes the RF generator 302. Moreover, the system 320 includes an impedance matching circuit 322, which is an example of the impedance matching circuit 106 (FIG. 1), or the branch circuit 170 (FIG. 1B), or the branch circuit 199 (FIG. 1C).

The RF generator 302 is coupled to the impedance matching circuit 322 via the RF cable 310. The output 134 of the impedance matching circuit 322 is coupled to the plasma chamber 108 via the RF transmission line 128.

The system 320 further includes the motor 312, the motor 314, a motor 328, and a motor 330. The motor 328 is an example of the motor M1, or the motor M3, or the motor M5 (FIG. 1C). Moreover, the motor 330 is an example of the motor M2, or the motor M4, or the motor M6 (FIG. 1C).

The series circuit 324 is coupled to the RF cable 310 via an input 332 of the impedance matching circuit 322. The input 332 is an example of the input 132, or the input 160, or the input 186 (FIG. 1C). The series circuit includes an inductor L3 in series with the capacitor C1. An end of the inductor L3 is coupled to the input 332 and another end is coupled to the capacitor C1. The shunt circuit 326 includes an inductor L4 in series with the capacitor C2. An end of the inductor L4 is coupled to the output 134 and to an end of the capacitor C1. Moreover, another end of the inductor L4 is coupled to the capacitor C2, which is coupled to the ground at its other end. The inductors L3 and L4 are variable.

The motor 328 is coupled via the one or more connection mechanisms to the inductor L3 and rotates to change an overlap area between a core of the inductor L3 and a coil of the inductor L3. For example, a core of an inductor surrounded by a coil of the inductor is displaced with respect to the coil to change an inductance of the inductor. The change in the overlap area, e.g., increases or decreases, an inductance of the inductor. Similarly, the motor 330 is coupled via the one or more connection mechanisms to the inductor L4 and rotates to change an overlap area between a core of the inductor L4 and a coil of the inductor L4.

In some embodiments, the inductors L1 and L2 are controlled to change the inductances of the inductors and instead of the capacitors C1 and C2, fixed capacitors are used in the impedance matching circuit 322. In various embodiments, one or more of the capacitor C1, the capacitor C2, the inductor L1, and the inductor L2 are controlled to reduce reflected power at the output 370 for the states S(n–N) through S(n).

Figure 3C:
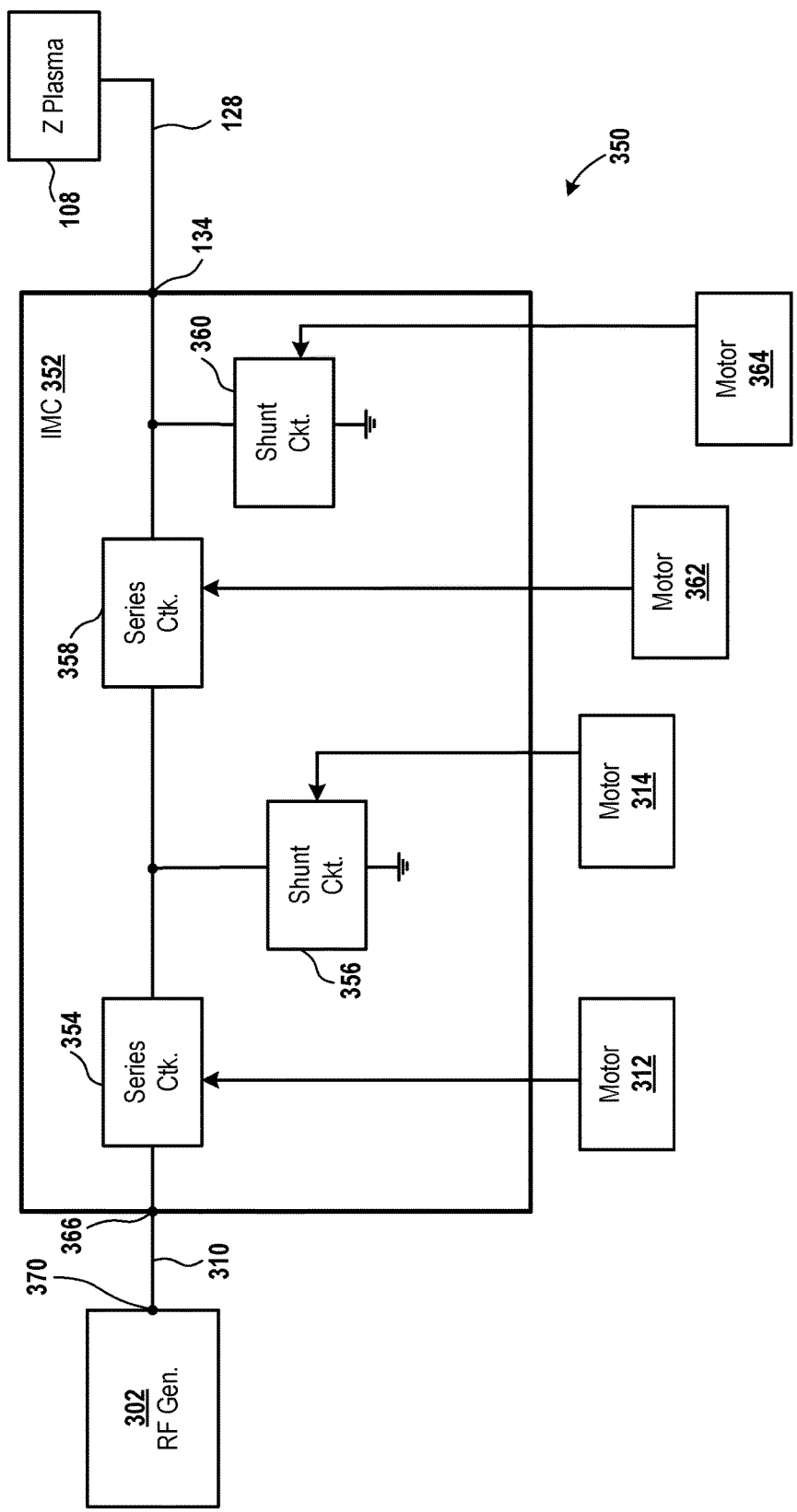
FIG. 3C is a diagram of an embodiment of a system to illustrate an impedance matching circuit that includes any number of series circuits and any number of shunt circuits.

FIG. 3C is a diagram of an embodiment of a system 350 to illustrate an impedance matching circuit 352 that includes any number of series circuits and any number of shunt circuits. The system 350 includes the RF generator 302, the impedance matching circuit 352, the plasma chamber 108, the motors 312 and 314, a motor 362, and a motor 364.

The RF generator 302 is coupled via the RF cable 310 to an input 366 of the impedance matching circuit 352. The impedance matching circuit 352 includes a series circuit 354, a shunt circuit 356, another series circuit 358, and another shunt circuit 360. An end of the series circuit 354 is coupled to the input 366 and another end of the series circuit 354 is coupled to an end of the shunt circuit 356. Moreover, the other end of the series circuit 354 is coupled to an end of the series circuit 358. Another end of the shunt circuit 356 is coupled to ground. Furthermore, another end of the series circuit 358 is coupled to an end of the shunt circuit 360 and to the output 134 of the impedance matching circuit 352. Another end of the shunt circuit 360 is coupled to the ground.

The motor 312 is coupled via one or more connection mechanisms to the series circuit 354. Moreover, the motor 314 is coupled via one or more connection mechanisms to the shunt circuit 356. Also, the motor 362 is coupled via one or more connection mechanisms to the series circuit 358. The motor 364 is coupled via one or more connection mechanisms to the shunt circuit 360.

Upon receiving current signals from drivers (not shown) that are connected to the motors 312, 314, 362, and 364, the motor 312 operates to change the parameter of the series circuit 354, the motor 314 operates to change the parameter of the shunt circuit 356, the motor 362 operates to change the parameter of the series circuit 358, and the motor 364 operates to change the parameter of the shunt circuit 360. The parameters of the circuits 354, 356, 358, and 360 are controlled for the states S(n–N) through S(n) so that reflected power at the output 370 of the RF generator 302 is reduced for the states S(n–N) through S(n) compared to reflected power that is reduced for one of the states S(n–N) through S(n) but not for the other one(s) of the states S(n–N) through S(n).

In some embodiments, the impedance matching circuit 352 includes a greater number of series circuits than shown in FIG. 3C and a greater number of shunt circuits than shown in FIG. 3C. For example, the end of the shunt circuit 360 that is coupled to the series circuit 358 is coupled to another series circuit (not shown), which is coupled to an end of another shunt circuit (not shown). The end of the shunt circuit (not shown) is coupled to the output 134. The other end of the other shunt circuit (not shown) is coupled to ground.

Figure 3D:
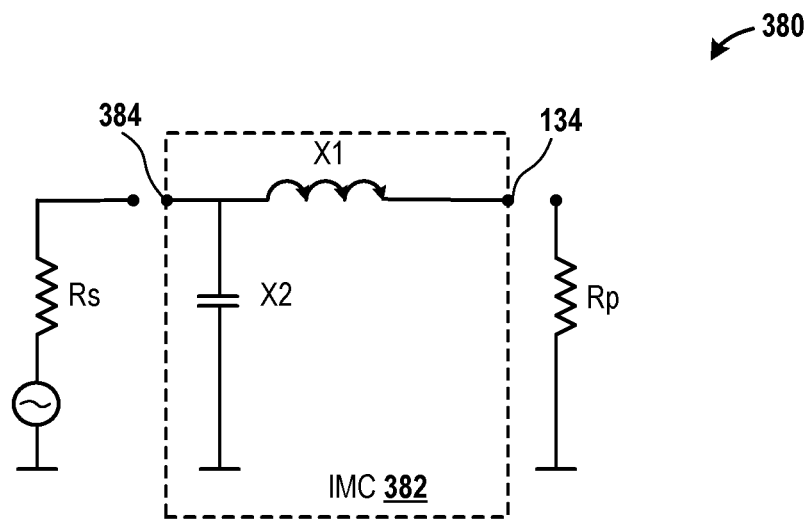
FIG. 3D is a diagram of an embodiment of a system to illustrate an impedance matching circuit, which is an L network.

FIG. 3D is a diagram of an embodiment of a system 380 to illustrate an impedance matching circuit 382, which is an L network. The impedance matching circuit 382 includes an inductor X1 and a capacitor X2. It should be noted that X, as described herein, represents a reactance of a circuit component, e.g., inductor, capacitor, etc. For example, X1 is a reactance of the inductor X1 and X2 is a reactance of the capacitor X2. The inductor X1 is variable or fixed. Similarly, the capacitor X2 is variable or fixed. An end of the capacitor X2 is coupled to ground and an end of the capacitor X2 is coupled to an end of the inductor X1 and to an input 384 of the impedance matching circuit 382. Another end of the inductor X1 is coupled to the output 134 of the impedance matching circuit 382.

It should be noted that the impedance matching circuit 382 is used instead of any other impedance matching circuits, described herein. For example, the impedance matching circuit 382 is used instead of the impedance matching circuit 106, or the branch circuit 170, or the branch circuit 199 (FIG. 1C). The impedance matching circuit 382 has the input 384, which is an example of the input 132, the input 160, or the input 186 (FIG. 1C).

It should be noted that an RF power supply is illustrated in FIG. 3B and the RF power supply is shown as being coupled to a resistor Rs, which is a resistance of a source that is coupled to the input 384. Moreover, a resistor Rp is illustrate in FIG. 3B. The resistor Rp has a resistance of a load that is coupled to the output 134.

Figure 3E:
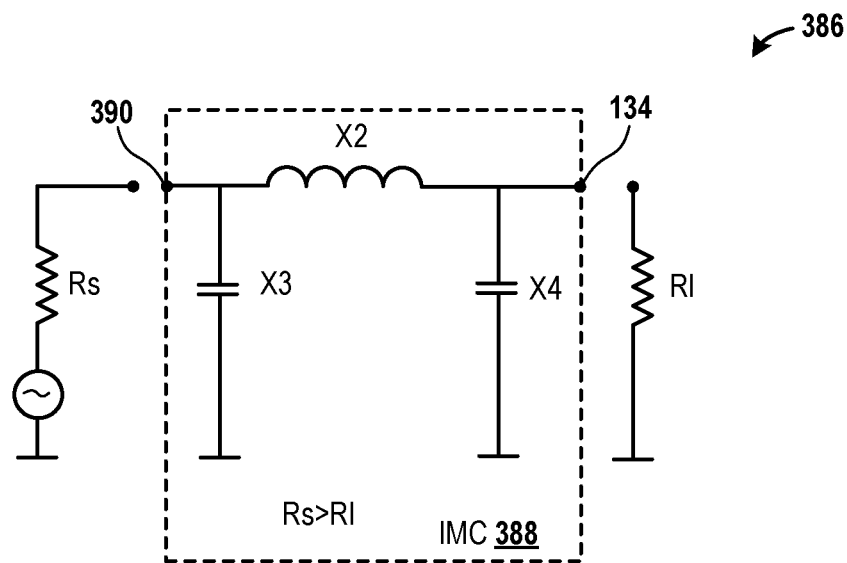
FIG. 3E is a diagram of an embodiment of a system to illustrate an impedance matching circuit, which is an Π network.

FIG. 3E is a diagram of an embodiment of a system 386 to illustrate an impedance matching circuit 388, which is an Π network. The impedance matching circuit 386 includes an inductor X2, a capacitor X3, and a capacitor X4. The inductor X2 is variable or fixed. Similarly, each of the capacitors X3 and X4 is variable or fixed. An end of the capacitor X3 is coupled to ground and another end of the capacitor X3 is coupled to an end of the inductor X2 and to an input 390 of the impedance matching circuit 388. Moreover, another end of the inductor X2 is coupled to an end of the capacitor X4 and another end of the capacitor X4 is coupled to ground. The other end of the inductor X2 is coupled to the output 134 of the impedance matching circuit 388. Moreover, a resistor RI is illustrate in FIG. 3C. The resistor RI has a resistance of a load that is coupled to the output 134.

Figure 3F:
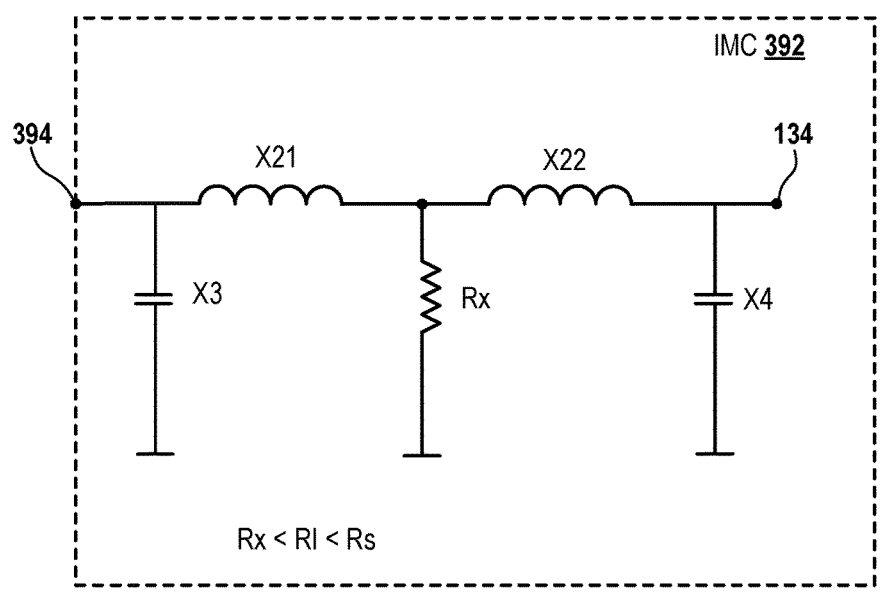
FIG. 3F is a diagram of an embodiment of a system to illustrate an impedance matching circuit, which is a Π network that includes two L networks.

FIG. 3F is a diagram of an embodiment of an impedance matching circuit 392, which is an Π network. The Π network is represented by two L networks. The impedance matching circuit 392 includes an inductor X21, the capacitor X3, a resistor Rx, another inductor X22, and the capacitor X4. Each of the inductors X21 and X22 is variable or fixed. Similarly, each of the capacitors X3 and X4 is variable or fixed. An end of the capacitor X3 is coupled to ground and another end of the capacitor X3 is coupled to an end of the inductor X21 and to an input 394 of the impedance matching circuit 392. Moreover, another end of the inductor X21 is coupled to an end of the resistor Rx and another end of the resistor Rx is coupled to ground. Also, the other end of the inductor X21 is coupled to an end of the inductor X22 and another end of the inductor X22 is coupled to an end of the capacitor X4. Another end of the capacitor X4 is coupled to ground. The other end of the inductor X22 and the end of the capacitor X4 are coupled to the output 134 of the impedance matching circuit 392.

It should be noted that the impedance matching circuit 388 is used instead of any other impedance matching circuit, described herein. For example, the impedance matching circuit 388 is used instead of the impedance matching circuit 106, or the branch circuit 170, or the branch circuit 199 (FIG. 1C).

Figure 4:
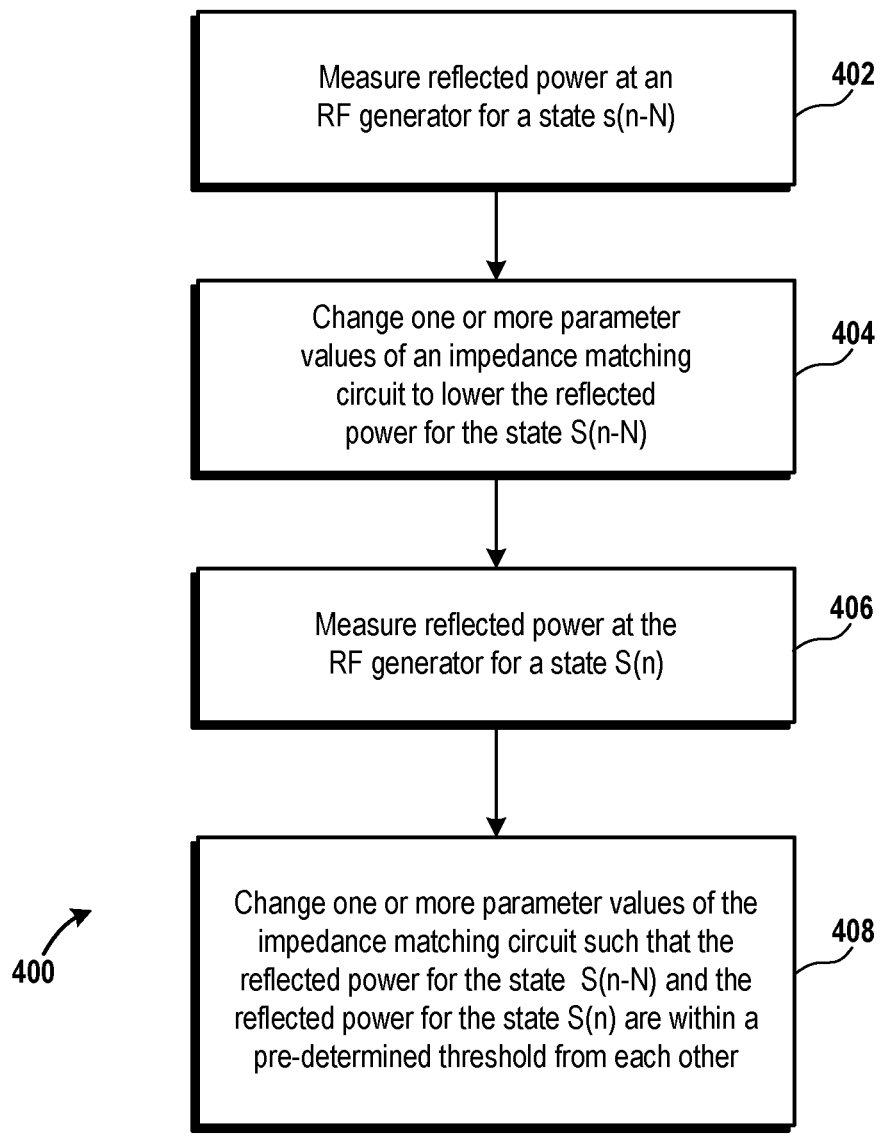
FIG. 4 is a diagram of an embodiment of a method to illustrate a determination of values of one or more parameters of an impedance matching circuit for which power reflected towards an RF generator is reduced for the states S(n–N) through S(n).

FIG. 4 is a diagram of an embodiment of a method 400 to illustrate determination of values of one or more parameters for which power reflected towards an RF generator is reduced for the states S(n–N) through S(n). The method 400 includes an operation 402 of measuring reflected power at an output of an RF generator for the state S(n–N). For example, during a time period in which an RF signal generated by the RF generator has the state S(n–N), the reflected power is measured at the output of the RF generator. A sensor of the RF generator, e.g., a sensor that is coupled to the output of the RF generator, measures the reflected power. The sensor is located within or outside the RF generator. The sensor provides measured values of the reflected power during the state S(n–N) to the processor 116 (FIG. 1C).

Moreover, in an operation 404 of the method 400, during the state S(n–N), values of one or more parameters, e.g., inductance, capacitance, etc., of an impedance matching circuit that is coupled to the RF generator via an RF cable are changed by the processor 116 so that power reflected at the output of the RF generator is reduced. For example, when the reflected power measured during the state S(n–N) is PRF1, values of the one or more parameters of the impedance matching circuit are CV1 and CV2. Moreover, when the values of the one or more parameters of the impedance matching circuit are changed from CV1 to CV3 and from CV2 to CV4, the reflected power measured during the state S(n–N) reduces to PRF2, which is lower than the value PRF1.

In an operation 406 of the method 400, the reflected power is measured at the output of the RF generator during the state S(n). For example, during a time period in which an RF signal generated by the RF generator has the state S(n), the reflected power is measured at the output of the RF generator by the sensor. The sensor provides measured values of the reflected power during the state S(n) to the processor 116.

In an operation 408 of the method 400, values of the one or more parameters of the impedance matching circuit are changed by the processor 116 during the state S(n) so that the reflected power measured at the output of the RF generator during both the states S(n) and S(n–N) is reduced. For example, during the state S(n), when the values of the one or more parameters of the impedance are controlled to be changed by the processor 116 from CV3 to CV5 and from CV4 to CV6, the reflected power reduces to PRF3, which is lower than the value PRF1. The value PRF3 is greater than the value PRF2. As another example, the value PRF3 is equal to or lower than the value PRF2. As an example, the values PRF2 and PRF3 are within the pre-determined threshold from each other. The pre-determined threshold is stored in the memory device 118 (FIG. 1C) for access by the processor 116. As yet another example, both the values PRF2 and PRF3 are lower than the pre-determined level and are within the pre-determined threshold from each other. The predetermined level is stored in the memory device 118 for access by the processor 116. The value PR1 is greater than the pre-determined level. After the operation 408, for the states S(n–N) through S(n), the values of the one or more parameters of the impedance matching circuit are maintained to be CV5 and CV6.

In some embodiments, after the operation 408, the values CV5 and CV6 are adjusted, e.g., increased or decreased, by the processor 116 to further reduce the reflected power at the output of the RF generator during the states S(n–N) through S(n) when power and/or frequency of the RF signal generated by the RF generator changes.

It should be noted that in various embodiments, when an impedance matching circuit, described herein, includes multiple parameter values that are to be determined so that reflected power at an output of an RF generator coupled to the impedance matching circuit is reduced for the states S(n–N) through S(n), a multivariate analysis method is applied by the processor 116 to determine the parameter values. For example, the processor 116 applies the multivariate analysis method to determine the capacitance and/or inductance values of a series circuit and a shunt circuit of the impedance matching circuit so that minimas of the reflected power at the output of the RF generator for the states S(n–N) through S(n) are below the pre-determined level and the minima of the reflected power at the output of the RF generator for the state S(n–N) is within the pre-determined threshold of the minima of the reflected power at the output of the RF generator for the state S(n).

In several embodiments, a neural network, e.g., a computer system modeled on a human brain, a network of computers modeled on a human brain, etc., determines a relationship between one or more values of the parameter of an impedance matching circuit, described herein, and the reflected power at an output of an RF generator, described herein, coupled to the impedance matching circuit. For example, regression analysis is applied by the neural network to determine the relationship based on values of the one or more parameters that are input to the neural network and values of the reflected power for the states S(n–N) through S(n). For example, values of the one or more parameters are inputs at input nodes of the neural network and the reflected power for the states S(n–N) through S(n) are outputs at output nodes of the neural network. The regression analysis is applied to determine the relationship between the inputs and the outputs. The relationship is then applied by the processor 116 or by the neural network, during processing of the substrate 112 (FIGS. 1A-1C), to determine values of the one or more parameters for which the reflected power at the output of the RF generator is reduced for the states S(n–N) through S(n).

Figure 5A:
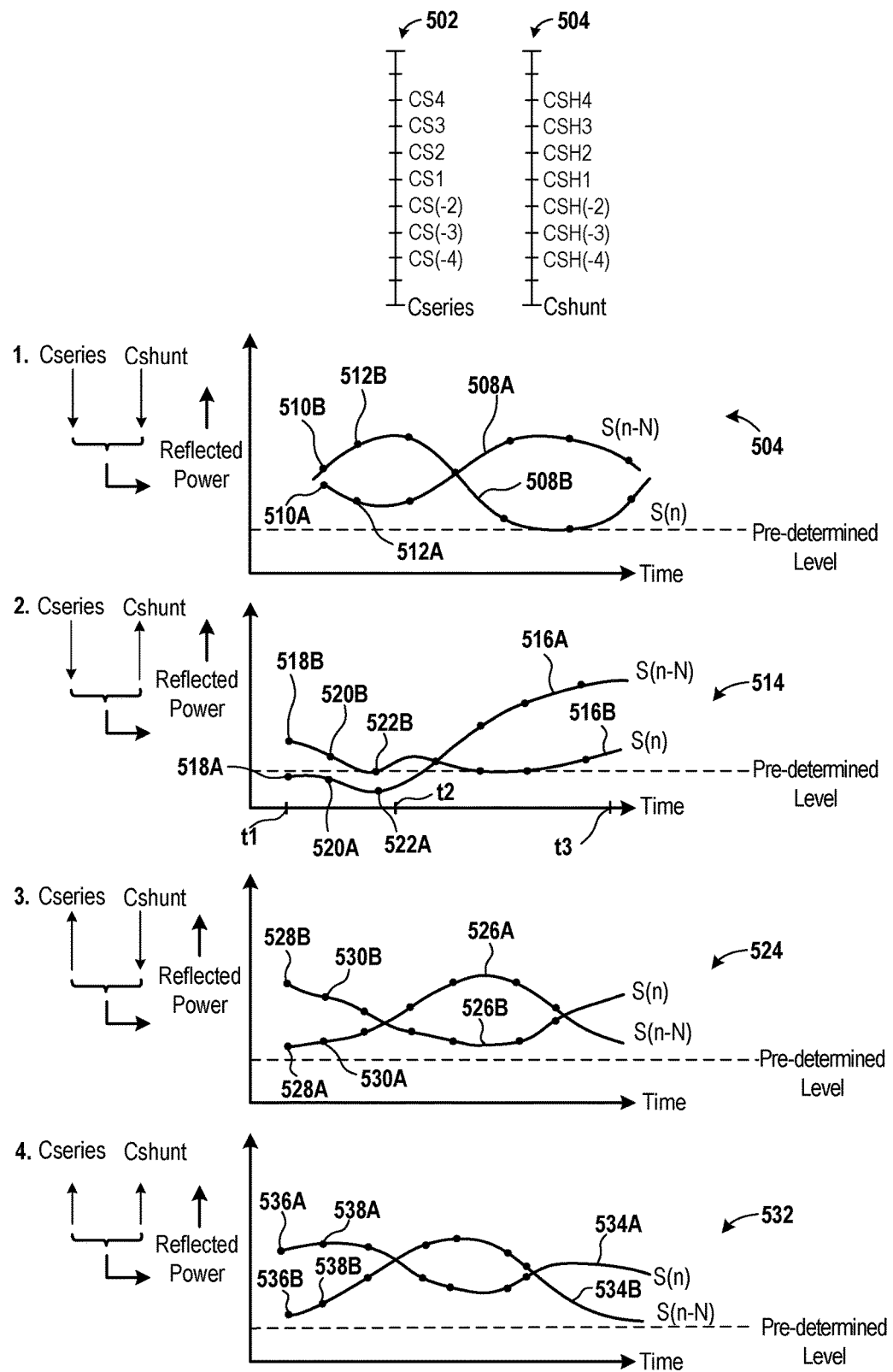
FIG. 5A is a diagram to illustrate a method for determining a capacitance Cseries of a series circuit of an impedance matching circuit and a capacitance Cshunt of a shunt circuit of the impedance matching circuit to reduce reflected power at an output of an RF generator for the states S(n–N) through S(n).

FIG. 5A is a diagram to illustrate a method for determining a capacitance Cseries of a series circuit of an impedance matching circuit, described herein, and a capacitance Cshunt of a shunt circuit of the impedance matching circuit to reduce reflected power at an output of an RF generator, described herein, for the states S(n–N) through S(n). In some embodiments, the capacitance of the series circuit of the impedance matching circuit is a combination of multiple capacitors in the series circuit. For example, the capacitance of the series circuit is a product of capacitances of capacitors that are coupled to each other in a serial manner in the series circuit divided by a sum of the capacitances. As another example, the capacitance of the series circuit of the impedance matching circuit is a sum of capacitances of capacitors that are coupled to each other in parallel manner in the series circuit. Similarly, the capacitance of the shunt circuit of the impedance matching circuit is a combination of multiple capacitors in the shunt circuit.

A line 502 has values of the capacitance Cseries and another line 504 has values of the capacitance Cshunt. When a value of the capacitance Cseries is decreased from a value CS1 and a value of the capacitance Cshunt is decreased from a value CSH1, values of reflected power at the output of the RF generator are measured during the states S(n–1) and S(n) and are plotted in a graph 506. The graph 506 plots the reflected power at the output of the RF generator versus time. The values, e.g., a value 510A, a value 512A, etc., of reflected power at the output of the RF generator during the state S(n–N) are shown in a plot 508A and the values, e.g., a value 510B, a value 512B, etc., of reflected power at the output of the RF generator during the state S(n) are shown in a plot 508B. To illustrate, the values 510A and 510B of reflected power are measured when the capacitance Cseries is CS(−2) and the capacitance Cshunt is CSH(−2). Moreover, the values 512A and 512B of reflected power are measured when the capacitance Cseries is CS(−3) and the capacitance Cshunt is CSH(−3). As shown in the graph 504, the values of reflected power at the output of the RF generator are greater than the pre-determined level during the states S(n−N) through S(n) and are therefore, not reduced for the states S(n−N) through S(n).

Furthermore, when a value of the capacitance Cseries is decreased from the value CS1 and a value of the capacitance Cshunt is increased from the value CSH1, values of reflected power at the output of the RF generator are measured during the states S(n−1) and S(n) and are plotted in a graph 514. The graph 514 plots the reflected power at the output of the RF generator versus time. The values, e.g., a value 518A, a value 520A, a value 522A, etc., of reflected power at the output of the RF generator during the state S(n−N) are shown in a plot 516A and the values, e.g., a value 518B, a value 520B, a value 522B, etc., of reflected power at the output of the RF generator during the state S(n) are shown in a plot 516B. To illustrate, the values 518A and 518B of reflected power are measured when the capacitance Cseries is CS(−2) and the capacitance Cshunt is CSH(2). Moreover, the values 520A and 520B of reflected power are measured when the capacitance Cseries is CS(−3) and the capacitance Cshunt is CSH(3). Also, the values 522A and 522B of reflected power are measured when the capacitance Cseries is CS(−4) and the capacitance Cshunt is CSH(4). As shown in the graph 514, the values 522A and 522B of reflected power at the output of the RF generator are less than the pre-determined level during the states S(n−N) through S(n). Moreover, the values 522A and 522B are within the pre-determined threshold from each other. To illustrate, the value 522A is an absolute minima of the plot 516A and the value 522B is an absolute minima of the plot 516B. In various embodiments, the value 522A is a local minima of the plot 516A and the value 522B is a local minima of the plot 516B. A local minima is a minimum value of the reflected power during a pre-set time period, e.g., between a time t1 and a time t2, in which the reflected power is measured. Comparatively, an absolute minima is a minimum value of the reflected power during an entire time period, e.g., between the time t1 and a time t3, in which the reflected power is measured. The capacitance values CS(−4) and CSH(4) are values of capacitances for which the reflected power at the output of the RF generator is reduced for the states S(n−N) through S(n) compared to reflected power that is reduced for one of the states S(n−N) through S(n) but not for the other one(s) of the states S(n−N) through S(n).

Moreover, when a value of the capacitance Cseries is increased from the value CS1 and a value of the capacitance Cshunt is decreased from the value CSH1, values of reflected power at the output of the RF generator are measured during the states S(n−1) and S(n) and are plotted in a graph 524. The graph 524 plots the reflected power at the output of the RF generator versus time. The values, e.g., a value 528A, a value 530A, etc., of reflected power at the output of the RF generator during the state S(n−N) are shown in a plot 526A and the values, e.g., a value 528B, a value 530B, etc., of reflected power at the output of the RF generator during the state S(n) are shown in a plot 526B. To illustrate, the values 526A and 526B of reflected power are measured when the capacitance Cseries is CS(2) and the capacitance Cshunt is CSH(−2). Moreover, the values 530A and 530B of reflected power are measured when the capacitance Cseries is CS(3) and the capacitance Cshunt is CSH(−3). As shown in the graph 524, the values of reflected power at the output of the RF generator are greater than the pre-determined level during the states S(n−N) through S(n).

Moreover, when a value of the capacitance Cseries is increased from the value CS1 and a value of the capacitance Cshunt is decreased from the value CSH1, values of reflected power at the output of the RF generator are measured during the states S(n−1) and S(n) and are plotted in a graph 524. The graph 524 plots the reflected power at the output of the RF generator versus time. The values, e.g., a value 528A, a value 530A, etc., of reflected power at the output of the RF generator during the state S(n−N) are shown in a plot 526A and the values, e.g., a value 528B, a value 530B, etc., of reflected power at the output of the RF generator during the state S(n) are shown in a plot 526B. To illustrate, the values 528A and 528B of reflected power are measured when the capacitance Cseries is CS(2) and the capacitance Cshunt is CSH(−2). Moreover, the values 530A and 530B of reflected power are measured when the capacitance Cseries is CS(3) and the capacitance Cshunt is CSH(−3). As shown in the graph 524, the values of reflected power at the output of the RF generator are greater than the pre-determined level during the states S(n−N) through S(n) and are therefore, not reduced for the states S(n−N) through S(n).

When a value of the capacitance Cseries is increased from the value CS1 and a value of the capacitance Cshunt is increased from the value CSH1, values of reflected power at the output of the RF generator are measured during the states S(n−1) and S(n) and are plotted in a graph 532. The graph 532 plots the reflected power at the output of the RF generator versus time. The values, e.g., a value 536A, a value 538A, etc., of reflected power at the output of the RF generator during the state S(n−N) are shown in a plot 534A and the values, e.g., a value 536B, a value 538B, etc., of reflected power at the output of the RF generator during the state S(n) are shown in a plot 534B. To illustrate, the values 536A and 536B of reflected power are measured when the capacitance Cseries is CS(2) and the capacitance Cshunt is CSH(2). Moreover, the values 538A and 538B of reflected power are measured when the capacitance Cseries is CS(3) and the capacitance Cshunt is CSH(3). As shown in the graph 532, the values of reflected power at the output of the RF generator are greater than the pre-determined level during the states S(n−N) through S(n) and are therefore, not reduced for the states S(n−N) through S(n).

In some embodiments, one of the capacitances Cseries and Cshunt is changed during the method illustrated in FIG. 5A and the other one of the capacitances Cseries and Cshunt is not changed.

In various embodiments, instead of modifying the capacitances Cseries and Cshunt, the method illustrated using FIG. 5A is equally applicable to changes in inductances of the series circuit of the impedance matching circuit and to changes in inductances the shunt circuit of the impedance matching circuit. In some embodiments, instead of modifying the capacitances Cseries and Cshunt, the method illustrated using FIG. 5A is equally applicable to changes in capacitances and inductances of the series circuit of the impedance matching circuit and to capacitances and inductances in the shunt circuit of the impedance matching circuit.

It should be noted that the method illustrated using FIG. 5A is an empirical process to obtain the minimas for the reflected power for the states S(n−N) through S(n). For example, the method illustrated using FIG. 5A is a multivariate adjustment method in which the values Cshunt and Cshunt are determined to obtain two goals, e.g., a minima of the reflected power during the state S(n–N) and a minima of the reflected power during the state S(n).

It should further be noted that the values CS(–4) through CS(4) are incremental with respect to each other. For example, the value CS(–4) is less than the value CS(–3), which is less than the values CS(–2). The value CS(–2) is less than the value CS(–1), which is less than the value CS(0). The value CS(0) is less than the value CS(1), which is less than the value CS(2). The value CS(2) is less than the value CS(3), which is less than the value CS(4). To further illustrate, the value CS(–4) is a unit, e.g., 0.1 picoFarad, 0.2 picoFarad, etc., less than the value CS(–3), which is a unit less than the values CS(–2). The value CS(–2) is a unit less than the value CS(–1), which is a unit less than the value CS(0). The value CS(0) is a unit less than the value CS(1), which is a unit less than the value CS(2). The value CS(2) is a unit less than the value CS(3), which is a unit less than the value CS(4).

Similarly, it should further be noted that the values CSH(–4) through CSH(4) are incremental with respect to each other. For example, the value CSH(–4) is less than the value CSH(–3), which is less than the values CSH(–2). The value CSH(–2) is less than the value CSH(–1), which is less than the value CSH(0). The value CSH(0) is less than the value CSH(1), which is less than the value CSH(2). The value CSH(2) is less than the value CSH(3), which is less than the value CSH(4). To further illustrate, the value CSH(–4) is a unit, e.g., 0.1 picoFarad, 0.2 picoFarad, etc., less than the value CSH(–3), which is a unit less than the values CSH(–2). The value CSH(–2) is a unit less than the value CSH(–1), which is a unit less than the value CSH(0). The value CSH(0) is a unit less than the value CSH(1), which is a unit less than the value CSH(2). The value CSH(2) is a unit less than the value CSH(3), which is a unit less than the value CSH(4).

Figure 5B:
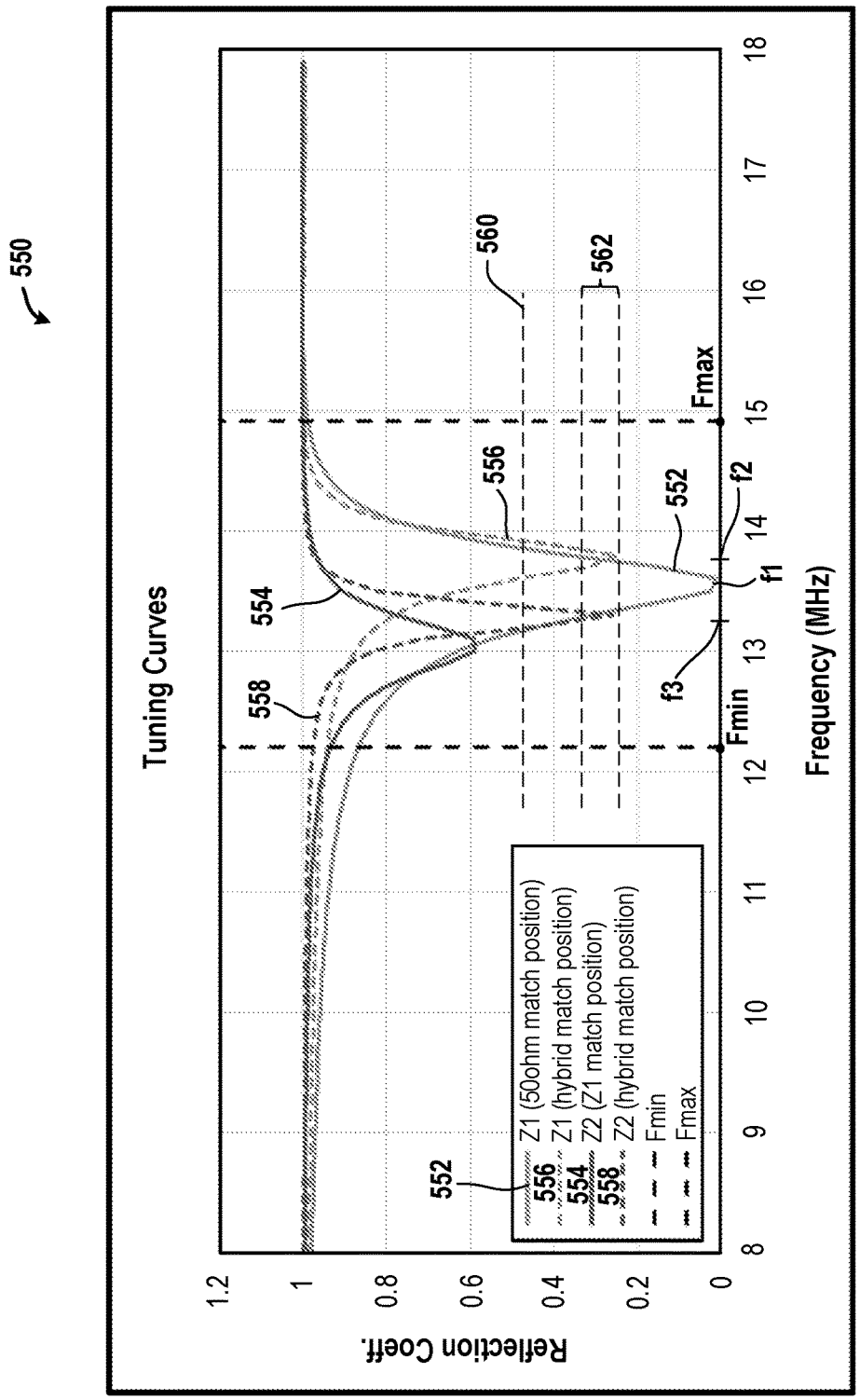
FIG. 5B is a diagram of an embodiment of a graph to illustrate a technical benefit of applying the methods for tuning to reduce reflected power in the states S(n–N) through S(n).

FIG. 5B is a diagram of an embodiment of a graph 550 to illustrate a technical benefit of applying the methods for tuning to reduce reflected power in the states S(n–N) through S(n). The graph 550 plots a reflection coefficient versus a frequency of an RF generator. The reflection coefficient is a measure of power reflected towards the RF generator. The graph 550 includes a plot 552, a plot 554, a plot 556, and a plot 558. In some embodiments, a reflection coefficient indicates an amount of an RF signal that is reflected towards an RF generator, e.g., the x MHz RF generator, or the y MHz RF generator, or the z MHz RF generator, from the plasma chamber 108 (FIG. 1C). For example, the reflection coefficient is equal a ratio of an amplitude of reflected power and an amplitude of forward power. The forward power is power supplied by the RF generator to the plasma chamber 108 via an impedance matching circuit.

The plot 552 is plotted when a reflection coefficient is zero or close to zero for a frequency of operation of the RF generator of f1 MHz, which is between a frequency of operation of Fmin and a frequency of operation of Fmax of the RF generator. Moreover, the plot 554 is plotted when values of the parameter for which the reflection coefficient for the state S(n–N) is minimum are used during the state S(n). For example, capacitance values of the series circuit 102 and the shunt circuit 104 (FIG. 1A) of the impedance matching circuit 106 of FIG. 1A for the state S1 are CA1 and CA2. When the capacitance values CA1 and CA2 are used during the state S2, the reflection coefficient at the output 136 of the x MHz RF generator is as illustrated in the plot 554. It should be noted that the reflection coefficient of the plot 554 is greater than the pre-determined level, illustrated by a reference numeral 560. For example, a minima of the plot 554 is greater than the pre-determined level 560.

When the methods illustrated in the flowchart 400 or the methods illustrated using FIGS. 1A through 1C or the methods illustrated using FIG. 5A or FIG. 6, described below, are applied, the reflection coefficient at the output of the RF generator for the state S(n–N) is plotted as 556 and for the state S(n) is plotted as 558. For example, when the parameter value of the series circuit 102 is CA3 and the parameter value of the shunt circuit 104 is CA4, for the state S(n–N), the reflection coefficient as illustrated by the plot 556 is achieved and for the state S(n), the reflection coefficient as illustrated by the plot 558 is achieved. It should be noted that the plot 556 has a minima, e.g., an absolute minima, etc., at a frequency f2 of the RF generator, e.g., the x MHz RF generator, and the plot 558 has a minima, e.g., an absolute minima, etc., at a frequency f3 of the RF generator. The minimas of the plots 556 and 558 are lower than the pre-determined limit 560 and are within a pre-determined threshold 562 from each other, which is a range of values of the reflection coefficient. The frequency values f2 and f3 are between the frequency values Fmin and Fmax.

In some embodiments, instead of measuring the reflected power, forward power and reflected power are measured by a sensor, described herein. The forward power and reflected power are provided to the processor 116 by the sensor to calculate a reflection coefficient. Moreover, any information, described above, that is applicable to reflected power is applicable to the reflection coefficient. For example, instead of the pre-determined level of reflected power, the pre-determined level is of the reflection coefficient. As another example, instead of the pre-determined threshold of reflected power, the pre-determined threshold is of the reflection coefficient. As yet another example, instead of the pre-determined range of reflected power, the pre-determined range is of the reflection coefficient. As another example, instead of the pre-determined limit of reflected power, the pre-determined limit is of the reflection coefficient.

Figure 6:
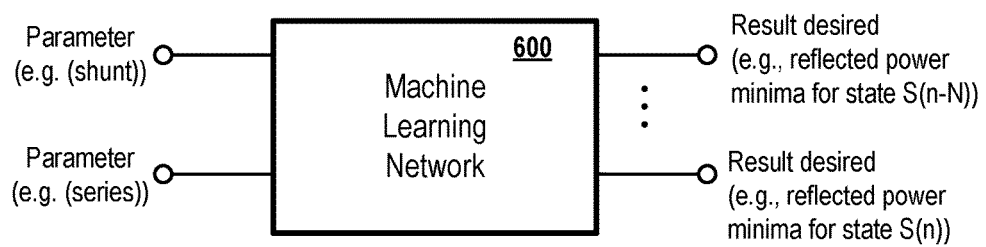
FIG. 6 is a diagram of an embodiment of a machine learning network to determine values of one or more parameters for which values of a variable for the states S(n–N) through S(n) are minimums.

FIG. 6 is a diagram of an embodiment of a machine learning network 600 to determine values of one or more parameters for which values of the variable for the states S(n–N) through S(n) are minimums. Examples, of the machine learning network 600 include a computer system modeled on a human brain, a network of computers modeled on a human brain, etc. A value of one of the parameters, e.g., Cseries, inductance, etc., of an impedance matching circuit, described herein, is received as an input, via an input device, e.g., a mouse, a keyboard, a button, a touchscreen, etc., and a value of the parameter, e.g., Cshunt, or another parameter, e.g., inductance, etc., of the impedance matching circuit is received as another input by the machine learning network 600. The machine learning network 600 processes the values received as inputs to calculate values of the variable, e.g., reflected power values, for the states S(n–N) through S(n) as outputs. Moreover, the machine learning network 600 determines whether the values of the variable for the states S(n–N) through S(n) are minimas. If the values of the variable for the states S(n–N) are not minimas, the machine learning network 600 performs backpropagation to change the values of the parameters received as the inputs and then determines again whether values of the variable for the states S(n–N) through S(n) are minimas. The machine learning network 600 continues iterating back and forth until values of the variable are minimas to find values of the one or more parameters for which values of the variable are minimas.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining operational parameters for carrying out a particular process on or for a semiconductor wafer or to a system. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, a capacitively coupled plasma reactor, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

In various embodiments, the RF transmission line 128 (FIGS. 1A-1C) is coupled to the upper electrode 114 instead of the chuck 111 and the chuck 111 is coupled to ground.

As noted above, depending on the process step or steps to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. A method for tuning to reduce reflected power in multiple states, comprising:
   supplying, by a radio frequency (RF) generator, power during a first state of a digital pulsed signal to a plasma chamber via an impedance matching circuit;
   measuring an amount of power reflected at an output of the RF generator during the first state;
   supplying, by the RF generator, power during a second state of the digital pulsed signal to the plasma chamber via the impedance matching circuit;
   measuring an amount of power reflected at the output of the RF generator during the second state; and
   controlling a parameter of the impedance matching circuit to reduce the amount of power measured during the first state to a minimum and to reduce the amount of power measured during the second state to a minimum.

2. The method of claim 1, wherein the minimum for the first state is less than a pre-determined level and the minimum for the second state is less than the pre-determined level.

3. The method of claim 2, wherein the minimum for the first state and the minimum for the second state are within a pre-determined threshold from each other.

4. The method of claim 1, wherein the minimum for the first state is less than another minimum for the first state, wherein the other minimum for the first state is achieved when the parameter has a first value, wherein the minimum for the first state and the minimum for the second state are achieved when the parameter has a second value.

5. The method of claim 1, wherein the minimum for the first state is greater than another minimum for the first state, wherein the other minimum for the first state is achieved when the parameter has a first value, wherein the minimum for the first state and the minimum for the second state are achieved when the parameter has a second value, wherein the other minimum for the first state is less than a pre-determined level, wherein when the parameter has the first value, another minimum for the second state is achieved, wherein the other minimum for the second state is less than the pre-determined level.

6. The method of claim 1, wherein controlling the parameter includes controlling a capacitor or an inductor of the impedance matching circuit, wherein the minimums for the first and second states correspond to a value of the parameter for the first and second states.

7. The method of claim 1, wherein the parameter is of a series circuit of the impedance matching circuit or of a shunt circuit of the impedance matching circuit, wherein said controlling is performed by applying a machine learning process.

8. A system for tuning to reduce reflected power in multiple states, comprising:
   a radio frequency (RF) generator configured to supply power during a first state of a digital pulsed signal;
   an impedance matching circuit coupled to the RF generator via an RF cable;
   a plasma chamber coupled to the impedance matching circuit via an RF transmission line;
   a sensor coupled to an output of the RF generator, wherein the sensor is configured to measure an amount of power reflected at the output of the RF generator during the first state,
   wherein the RF generator is configured to supply power during a second state of the digital pulsed signal to the plasma chamber via the impedance matching circuit,
   wherein the sensor is configured to measure an amount of power reflected at the output of the RF generator during the second state; and
   a processor coupled to the impedance matching circuit to control a parameter of the impedance matching circuit, wherein the parameter is controlled to reduce the amount of power measured during the first state to a minimum and to reduce the amount of power measured during the second state to a minimum.

9. The system of claim 8, wherein the minimum for the first state is less than a pre-determined level and the minimum for the second state is less than the pre-determined level.

10. The system of claim 9, wherein the minimum for the first state and the minimum for the second state are within a pre-determined threshold from each other.

11. The system of claim 8, wherein the minimum for the first state is less than another minimum for the first state, wherein the other minimum for the first state is achieved when the parameter has a first value, wherein the minimum for the first state and the minimum for the second state are achieved when the parameter has a second value.

12. The system of claim 8, wherein the minimum for the first state is greater than another minimum for the first state, wherein the other minimum for the first state is achieved when the parameter has a first value, wherein the minimum for the first state and the minimum for the second state are achieved when the parameter has a second value, wherein the other minimum for the first state is less than a pre-determined level, wherein when the parameter has the first value, another minimum for the second state is achieved, wherein the other minimum for the second state is less than the pre-determined level.

13. The system of claim 8, wherein the parameter is of a capacitor or an inductor of the impedance matching circuit.

14. The system of claim 8, wherein the parameter is of a series circuit of the impedance matching circuit or of a shunt circuit of the impedance matching circuit.

15. A non-transitory computer readable medium storing a program causing a computer to execute a method comprising:
supplying, by a radio frequency (RF) generator, power during a first state of a digital pulsed signal to a plasma chamber via an impedance matching circuit;
receiving a measurement of an amount of power reflected at an output of the RF generator during the first state;
supplying, by the RF generator, power during a second state of the digital pulsed signal to the plasma chamber via the impedance matching circuit;
receiving a measurement of an amount of power reflected at the output of the RF generator during the second state; and
controlling a parameter of the impedance matching circuit to reduce the amount of power measured during the first state to a minimum and to reduce the amount of power measured during the second state to a minimum.

16. The non-transitory computer readable medium of claim 15, wherein the minimum for the first state is less than a pre-determined level and the minimum for the second state is less than the pre-determined level.

17. The non-transitory computer readable medium of claim 16, wherein the minimum for the first state and the minimum for the second state are within a pre-determined threshold from each other.

18. The non-transitory computer readable medium of claim 15, wherein the minimum for the first state is less than another minimum for the first state, wherein the other minimum for the first state is achieved when the parameter has a first value, wherein the minimum for the first state and the minimum for the second state are achieved when the parameter has a second value.

19. The non-transitory computer readable medium of claim 15, wherein the minimum for the first state is greater than another minimum for the first state, wherein the other minimum for the first state is achieved when the parameter has a first value, wherein the minimum for the first state and the minimum for the second state are achieved when the parameter has a second value, wherein the other minimum for the first state is less than a pre-determined level, wherein when the parameter has the first value, another minimum for the second state is achieved, wherein the other minimum for the second state is less than the pre-determined level.

20. The non-transitory computer readable medium of claim 15, wherein controlling the parameter includes controlling a capacitor or an inductor of the impedance matching circuit.

* * * * *